United States Patent [19]
Forrest et al.

[11] Patent Number: 5,703,436
[45] Date of Patent: Dec. 30, 1997

[54] TRANSPARENT CONTACTS FOR ORGANIC DEVICES

[75] Inventors: Stephen R. Forrest, Princeton, N.J.; Mark E. Thompson, Anaheim Hills, Calif.; Paul E. Burrows, Princeton, N.J.; Vladimir Bulovic, Metuchen, N.J.; Gong Gu, Princeton, N.J.

[73] Assignee: The Trustees Of Princeton University, Princeton, N.J.

[21] Appl. No.: 613,207

[22] Filed: Mar. 6, 1996

Related U.S. Application Data

[63] Continuation-in-part of Ser. No. 354,674, Dec. 13, 1994.

[51] Int. Cl.$^6$ .................................................. H01J 1/62
[52] U.S. Cl. ........................... 313/506; 313/503; 313/509
[58] Field of Search .............................. 313/498, 503, 313/504, 505, 506, 509; 345/4, 79, 76; 257/40

[56] References Cited

U.S. PATENT DOCUMENTS

| | | | |
|---|---|---|---|
| 3,611,069 | 10/1971 | Galginaitis et al. | |
| 3,783,353 | 1/1974 | Pankove | 317/235 R |
| 3,840,873 | 10/1974 | Usui | 340/378 R |
| 3,875,456 | 4/1975 | Kano et al. | 313/501 |
| 4,365,260 | 12/1982 | Holonyak, Jr. | 357/17 |
| 4,577,207 | 3/1986 | Copeland | 357/17 |
| 4,605,942 | 8/1986 | Camlibel et al. | 357/17 |
| 4,900,584 | 2/1990 | Tuenge et al. | 427/66 |
| 5,059,861 | 10/1991 | Littman | 313/503 |
| 5,075,743 | 12/1991 | Behfar-Rad | 357/17 |
| 5,077,588 | 12/1991 | Yamada et al. | 357/17 |
| 5,144,473 | 9/1992 | Gemma et al. | 359/270 |
| 5,166,761 | 11/1992 | Olson et al. | 257/46 |

(List continued on next page.)

OTHER PUBLICATIONS

K.L. Chopra et al., "Transparent Conductors-A Status Review", *Thin solid Films*, vol. 102 (1983).

T. Karasawa and Y. Miyata, "Electrical and Optical Properties of Indium Tin Oxide Thin Films Deposited on Unheated Substrates by D.C. Reactive Sputtering", *Thin Solid Films*, vol. 223 (1993).

S.B. Lee et al., "Electronic and Optical Properties of Room Temperature Sputter Deposited Indium Tin Oxide", *J. Vac. Sci. Technol. A*, 11(5), Sep/Oct. 1993.

S. Honda et al., "Oxygen Content of Indium Tin Oxide Films Fabricated by Reactive Sputtering", *J. Vac. Sci. Technol. A*, 13(3), May/Jun. 1995.

(List continued on next page.)

Primary Examiner—Sandra L. O'Shea
Assistant Examiner—Vip Patel
Attorney, Agent, or Firm—Watov & Kipnes, P. C.

[57] ABSTRACT

A multicolor organic light emitting device employs vertically stacked layers of double heterostructure devices which are fabricated from organic compounds. The vertical stacked structure is formed on a glass base having a transparent coating of ITO or similar metal to provide a substrate. Deposited on the substrate is the vertical stacked arrangement of three double heterostructure devices, each fabricated from a suitable organic material. Stacking is implemented such that the double heterostructure with the longest wavelength is on the top of the stack. This constitutes the device emitting red light on the top with the device having the shortest wavelength, namely, the device emitting blue light, on the bottom of the stack. Located between the red and blue device structures is the green device structure. The devices are configured as stacked to provide a staircase profile whereby each device is separated from the other by a thin transparent conductive contact layer to enable light emanating from each of the devices to pass through the semitransparent contacts and through the lower device structures while further enabling each of the devices to receive a selective bias. The devices are substantially transparent when de-energized, making them useful for heads-up display applications.

29 Claims, 25 Drawing Sheets

U.S. PATENT DOCUMENTS

| | | | |
|---|---|---|---|
| 5,231,049 | 7/1993 | Neugebauer et al. | 437/128 |
| 5,294,869 | 3/1994 | Tang et al. | 313/504 |
| 5,294,870 | 3/1994 | Tang et al. | 313/504 |
| 5,315,129 | 5/1994 | Forrest et al. | 257/21 |
| 5,391,896 | 2/1995 | Wanlass | 257/80 |
| 5,405,710 | 4/1995 | Dodabalapur et al. | 428/690 |
| 5,409,783 | 4/1995 | Tang et al. | 428/690 |
| 5,424,560 | 6/1995 | Norman et al. | 257/40 |
| 5,429,884 | 7/1995 | Namiki et al. | 428/690 |
| 5,456,988 | 10/1995 | Sano et al. | 313/506 |
| 5,457,565 | 10/1995 | Namiki et al. | 359/273 |
| 5,478,658 | 12/1995 | Dodabalapur et al. | 428/690 |
| 5,540,999 | 7/1996 | Yamamoto et al. | 313/506 |
| 5,598,059 | 1/1997 | Sun et al. | 313/506 |
| 5,604,398 | 2/1997 | Zyung et al. | 313/506 |

OTHER PUBLICATIONS

K. Sreenivas, et al. "Preparation and Characterization of RF Sputtered Indium Tin Oxide Films", *J. Appl. Phys.*, 57(2), Jan. 15,1985.

L. R. Gilbert et al., "Comparison of ITO Sputtering Process from a Ceramic and Alloy Targets onto Room Temperature PET Substrates", *Society for Vacuum Pauters*, 36 Conf. Proc., 1993, p. 236.

Yuji Hamada, Takeshi Sano, Masayaki Fujita, Takanori Fujii, Yoshitaka Nishio and Kenichi Shibata; "Blue Electroluminescence in Thin Films of Azomethin–Zinc Complexes", *Japanese Journal of Applied Physics*, 1993, vol. 32, pp. L511–L513.

Junji Kido and Katsutoshi Nagai, "Organic Electroluminescent Devices Using Lanthanide Complexes", *Journal of Alloys and Compounds*, 1993, vol. 192, pp. 30–33.

Curtis E. Johnson, Richard Eisenberg, Ted R. Evans, and Mitch S. Burberry, "Luminescent Iridium(I), Rhodium(I), and Platinum(II) Dithiolate Complexes", *Journal of the American Chemical Society*, 1983, vol. 105, pp. 1795–1802.

S. W. Depp and W. E. Howard, "Flat Panel Displays", *Scientific American*, Mar. 1993, pp. 90–97.

P.E. Burrows, L.S. Sapochak, D.M. McCarty, S.R. Forrest, and M.E. Thompson, "Metal Ion Dependent Luminescence Effects in Metal Tris–Quinolate Organic Heterojunction Light Emitting Devices", *Appl. Phys. Lett.*, 64, p. 2718 (1994).

C.W. Tang and S.A. VanSlyke, "Organic Electroluminescent Diodes", *Appl. Phys. Lett.*, 51, p. 913 (1987).

N. Takada, T. Tsutsui, and S. Saito, "Strongly Directed Emission from Controlled–Spontaneous–Emmission electroluminescent Diodes with Europium Complex as an Emitter", *Japanese J. Appl. Phys.*, p. 33, L863 (1994).

C. Adachi, T. Tsutsui, and S. Saito, "Blue Light–Emitting Organic Electroluminescent Devices", *Appl. Phys. Lett.*, 56, p. 799 (1990).

P.E. Burrows and S.R. Forest, "Electroluminescence from Trap–Limited Current Transport in Vacuum Deposited Organic Light Emitting Devices", *Appl. Phys. Lett.*, 64, p. 2285 (1993).

D.Z. Garbuzov, V. Bulovic, P.E. Burrows, and S.R. Forest, "Photoluminescence Efficiency and Abosorption of Aluminum–Tris–Quinolate ($Alq_3$)Thin Films", *Chem Phys. Lett.*, (1996).

LIGHT

LIGHT

LIGHT picolyketone quinaldylketone phenoxypyridine 3,5-di(t-bu)phenol 2,6-di(t-bu)phenol 2,6-di(t-bu)cresol $H_2Bpz_2$

TRANSPARENT CONTACTS FOR ORGANIC DEVICES

This application is a continuation-in-part of U.S. Ser. No. 08/354,674, filed on Dec. 13, 1994, and entitled "MULTI-COLOR ORGANIC LIGHT EMITTING DEVICES".

FIELD OF THE INVENTION

This invention relates to multicolor organic light emitting devices, and more particularly to such devices for use in flat panel electronic displays, heads-up displays, and so forth.

BACKGROUND OF THE INVENTION

The electronic display is an indispensable way in modern society to deliver information and is utilized in television sets, computer terminals and in a host of other applications. No other medium offers its speed, versatility and interactivity. Known display technologies include plasma displays, light emitting diodes (LEDs), thin film electroluminescent displays, and so forth.

The primary non-emissive technology makes use of the electro optic properties of a class of organic molecules known as liquid crystals (LCs) or liquid crystal displays (LCDs). LCDs operate fairly reliably but have relatively low contrast and resolution, and require high power backlighting. Active matrix displays employ an array of transistors, each capable of activating a single LC pixel. There is no doubt that the technology concerning flat panel displays is of a significant concern and progress is continuously being made. See an article entitled "Flat Panel Displays", Scientific American, March 1993, pgs. 90–97 by S. W. Depp and W. E. Howard. In that article, it is indicated that by 1995 flat panel displays alone are expected to form a market of between 4 and 5 billion dollars. Desirable factors for any display technology is the ability to provide a high resolution full color display at good light level and at competitive pricing.

Color displays operate with the three primary colors red (R), green (G) and blue (B). There has been considerable progress in demonstrating red, green and blue light emitting devices (LEDs) using organic thin film materials. These thin film materials are deposited under high vacuum conditions. Such techniques have been developed in numerous places throughout the world and this technology is being worked on in many research facilities.

Presently, the most favored high efficiency organic emissive structure is referred to as the double heterostructure LED which is shown in FIG. 1A and designated as prior art. This structure is very similar to conventional, inorganic LED's using materials as GaAs or InP.

In the device shown in FIG. 1A, a support layer of glass 10 is coated by a thin layer of Indium Tin Oxide (ITO) 11, where layers 10 and 11 form the substrate. Next, a thin (100–500 Å) organic, predominantly hole transporting layer (HTL) 12 is deposited on the ITO layer 11. Deposited on the surface of HTL layer 12 is a thin (typically, 50 Å–100 Å) emission layer (EL) 13. If the layers are too thin there may be lack of continuity in the film, and thicker films tend to have a high internal resistance requiring higher power operation. Emissive layer (EL) 13 provides the recombination site for electrons injected from a 100–500 Å thick electron transporting layer 14 (ETL) with holes from the HTL layer 12. The ETL material is characterized by its considerably higher electron than hole mobility. Examples of prior art ETL, EL and HTL materials are disclosed in U.S. Pat. No. 5,294,870 entitled "Organic Electroluminescent MultiColor Image Display Device", issued on Mar. 15, 1994 to Tang et al.

Often, the EL layer 13 is doped with a highly fluorescent dye to tune color and increase the electroluminescent efficiency of the LED. The device as shown in FIG. 1A is completed by depositing metal contacts 15, 16 and top electrode 17. Contacts 15 and 16 are typically fabricated from indium or Ti/Pt/Au. Electrode 17 is often a dual layer structure consisting of an alloy such as Mg/Ag 17' directly contacting the organic ETL layer 14, and a thick, high work function metal layer 17" such as gold (Au) or silver (Ag) on the Mg/Ag. The thick metal 17" is opaque. When proper bias voltage is applied between top electrode 17 and contacts 15 and 16, light emission occurs through the glass substrate 10. An LED device of FIG. 1A typically has luminescent external quantum efficiencies of from 0.05 percent to 4 percent depending on the color of emission and its structure.

Another known organic emissive structure referred as a single heterostructure is shown in FIG. 1B and designated as prior art. The difference in this structure relative to that of FIG. 1A, is that the EL layer 13 serves also as an ETL layer, eliminating the ETL layer 14 of FIG. 1A. However, the device of FIG. 1B, for efficient operation, must incorporate an EL layer 13 having good electron transport capability, otherwise a separate ETL layer 14 must be included as shown for the device of FIG. 1A.

Presently, the highest efficiencies have been observed in green LED's. Furthermore, drive voltages of 3 to 10 volts have been achieved. These early and very promising demonstrations have used amorphous or highly polycrystalline organic layers. These structures undoubtedly limit the charge carrier mobility across the film which, in turn, limits current and increases drive voltage. Migration and growth of crystallites arising from the polycrystalline state is a pronounced failure mode of such devices. Electrode contact degradation is also a pronounced failure mechanism.

Yet another known LED device is shown in FIG. 1C, illustrating a typical cross sectional view of a single layer (polymer) LED. As shown, the device includes a glass support layer 1, coated by a thin ITO layer 3, for forming the base substrate. A thin organic layer 5 of spin-coated polymer, for example, is formed over ITO layer 3, and provides all of the functions of the HTL, ETL, and EL layers of the previously described devices. A metal electrode layer 6 is formed over organic layer 5. The metal is typically Mg, Ca, or other conventionally used metals.

An example of a multicolor electroluminescent image display device employing organic compounds for light emitting pixels is disclosed in Tang et al., U.S. Pat. No. 5,294, 870. This patent discloses a plurality of light emitting pixels which contain an organic medium for emitting blue light in blueemitting subpixel regions. Fluorescent media are laterally spaced from the blue-emitting subpixel region. The fluorescent media absorb light emitted bythe organic medium and emit red and green light in different subpixel regions. The use of materials doped with fluorescent dyes to emit green or red on absorption of blue light from the blue subpixel region is less efficient than direct formation via green or red LED's. The reason is that the efficiency will be the product of (quantum efficiency for EL)*(quantum efficiency for fluorescence)*(1-transmittance). Thus a drawback of this display is that different laterally spaced subpixel regions are required for each color emitted.

SUMMARY OF THE INVENTION

It is an object of the present invention to provide a multicolor organic light emitting device employing several types of organic electroluminescent media, each for emitting a distinct color.

It is a further object of this invention to provide such a device in a high definition multicolor display in which the organic media are arranged in a stacked configuration such that any color can be emitted from a common region of the display.

It is another object of the present invention to provide a three color organic light emitting device which is extremely reliable, substantially transparent when de-energized, and relatively inexpensive to produce.

It is a further object to provide such a device which is implemented by the growth of organic materials similar to those materials used in electroluminescent diodes, to obtain an organic LED which is highly reliable, compact, efficient and requires low drive voltages for utilization in RGB displays.

In one embodiment of the invention, a multicolor light emitting device (LED) structure comprises at least a first and a second organic LED stacked one upon the other, and preferably three, to form a layered structure, with each LED separated one from the other by a transparent conductive layer to enable each device to receive a separate bias potential to emit light through the stack.

DETAILED DESCRIPTION OF THE INVENTION

Figure 1A:
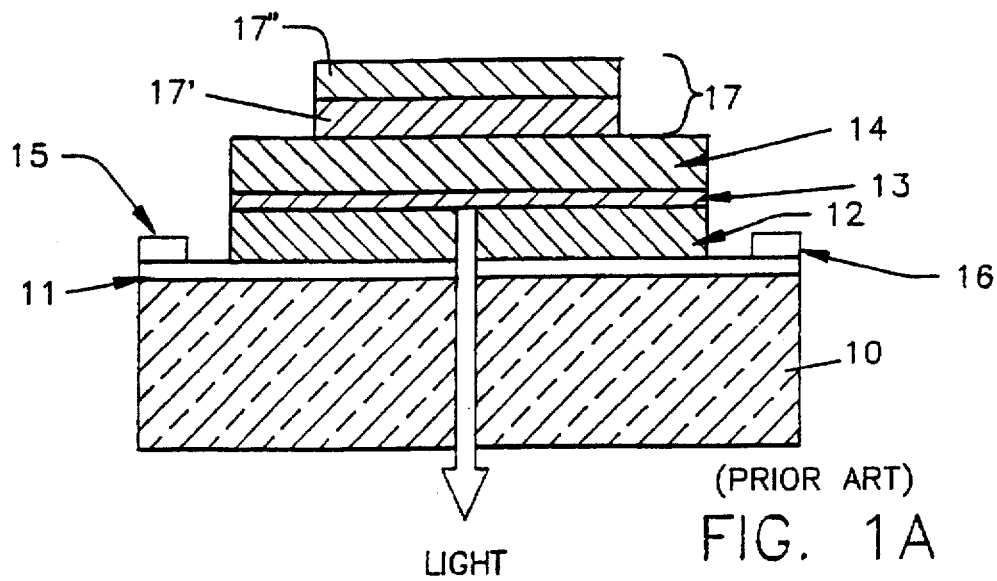
FIG. 1A is a cross sectional view of a typical organic double heterostructure light emitting device (LED) according to the prior art.

FIG. 1A has been described and is a prior art double heterostructure organic light emitting device. The basic construction of the device of FIG. 1A is used in this invention as will be described.

Figure 1B:
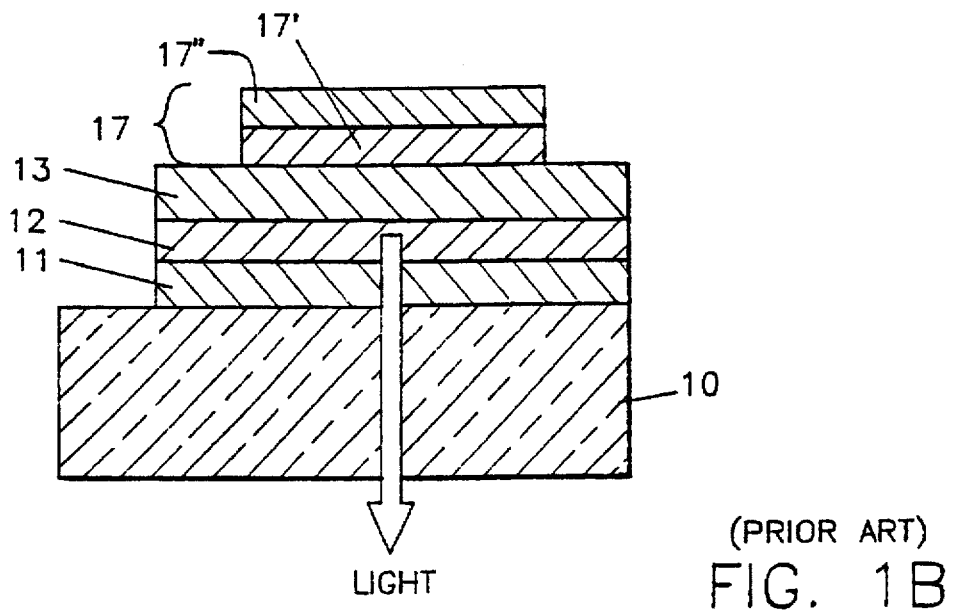
FIG. 1B is a cross sectional view of a typical organic single heterostructure light emitting device (LED) according to the prior art.
Figure 1C:
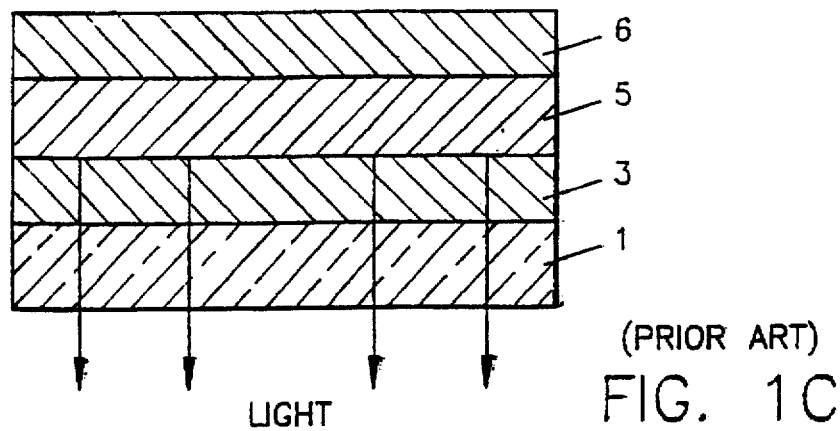
FIG. 1C is a cross sectional view of a known single layer polymer LED structure according to the prior art.
Figure 2A:
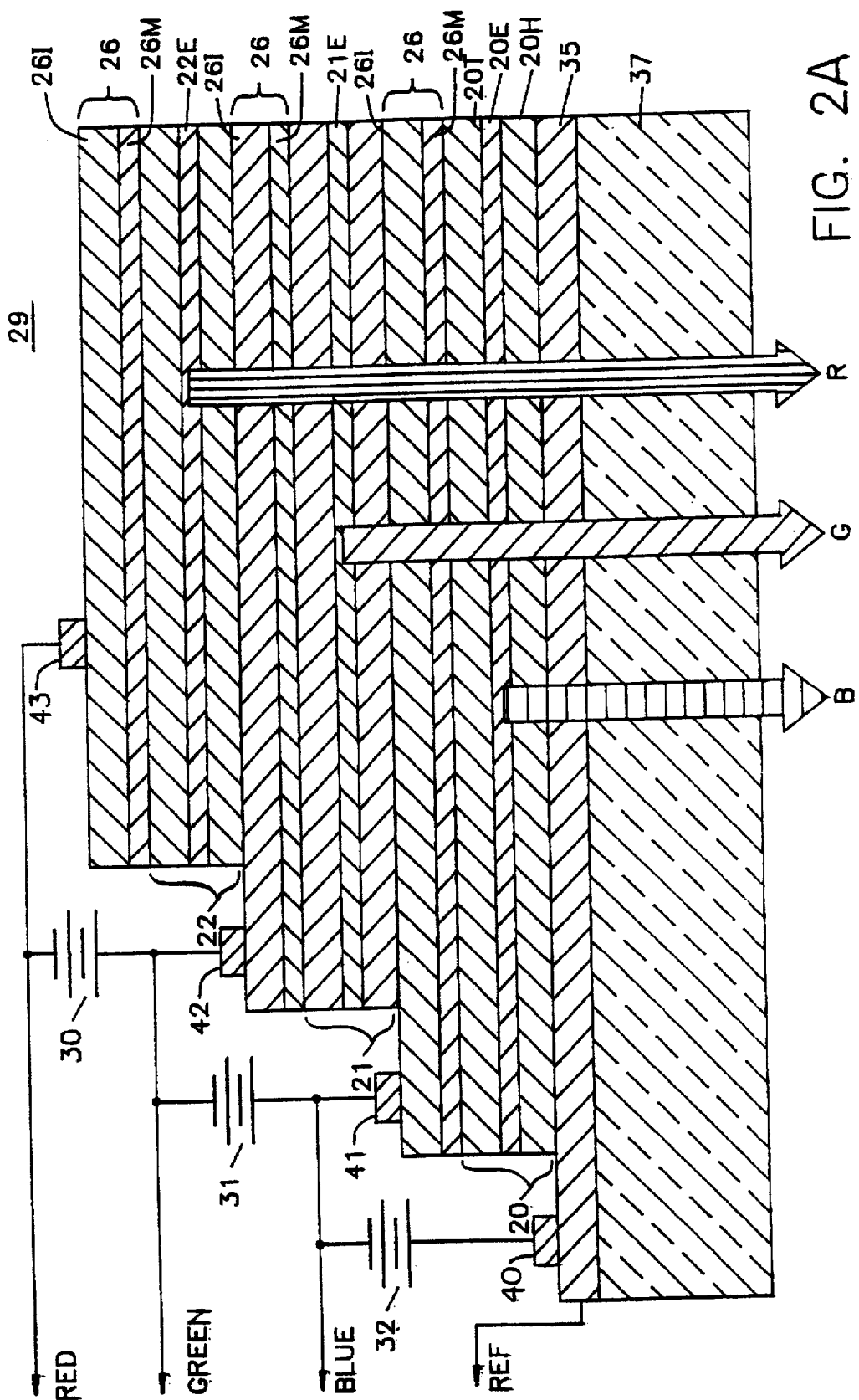
FIGS. 2A, 2B, and 2C are cross sectional views of an integrated three color pixel utilizing crystalline organic light emitting devices (LED's), respectively, according to embodiments of this invention, respectively.

Referring to FIG. 2A, there is shown a schematic cross section of a highly compact, integrated RGB pixel structure which is implemented by grown or vacuum deposited organic layers, in one embodiment of the invention. Based on the ability to grow organic materials on a large variety of materials (including metals and ITO), one can construct a stack of LED double heterostructures (DH) designated as 20, 21 and 22, in one embodiment of the invention. For illustrative purposes, LED 20 is considered in a bottom portion of the stack, LED 21 in a middle portion of the stack, and LED 22 in a top portion of the stack, in the example of FIG. 2A. Also, the stack is shown to be vertically oriented in FIG. 2A, but the LED can be otherwise oriented. In other embodiments, a stack of single heterostructure (SH) LED's (see FIG. 1B), or a stack of polymerbased LED devices (see FIG. 1C), are viable alternatives to the DH LED's, with the SH devices being equally viable as DH devices for light emitters. Also, SH and DH devices comprising a combination of vacuum deposited and polymeric light-emitting materials are considered to be within the spirit and scope of this invention.

Each device structure as device 20, consists of an HTL layer 20H vacuum-deposited or grown on or otherwise deposited onto the surface of an ITO layer 35. A top ETL layer 20T sandwiches an EL layer 20E between the former and HTL layer 20H, for example, shown in the device construction of FIG. 2A. The ETL layer 20T and other ETL layers to be described are composed of organic materials such as M(8-hydroxyquinolate)$_n$ (M=metal ion; n=2–4). Examples of other suitable organic ETL materials can be found in U.S. Pat. No. 5,294,870 to Tang et al. Formed on top of ETL layer 20T is a thin, semi-transparent low work function (preferably, <4 eV) metal layer 26M having a thickness typically ranging from 50 Å to 400 Å. Suitable candidates include Mg, Mg/Ag, and As. Deposited on the top of metal layer 26M is another transparent, thin conductive ITO layer 26I. (For convenience herein, the double layer structure of metallic layer 26M and ITO layer 26I is referred to as ITO/metal layers 26.) Each of the double heterostructure devices as 20, 21 and 22 have a bottom HTL layer formed on a transparent conductive layer of ITO 26I or 35. Next an EL layer is deposited and then another layer of ETL. Each of the HTL, ETL, ITO, metal and organic EL layers are transparent because of their composition and minimal thickness. Each HTL layer may be 50 Å to greater than 1000 Å thick; each EL layer may be 50 to greater than 200 Å thick; each ETL layer may be 50 Å to greater than 1000 Å thick; each metal layer 26M may be 50 Å to greater than 100 Å thick; and each ITO layer 26I and 35 may be 1000 Å to greater than 4000 Å thick. For optimum performance, each of the layers should preferably be kept towards the lower ends of the above ranges, but these ranges are not meant to be limiting. Thus, each LED 20, 21 and 22 (excluding ITO/metal layers) are preferably close to 200 Å thick.

Figure 2B:
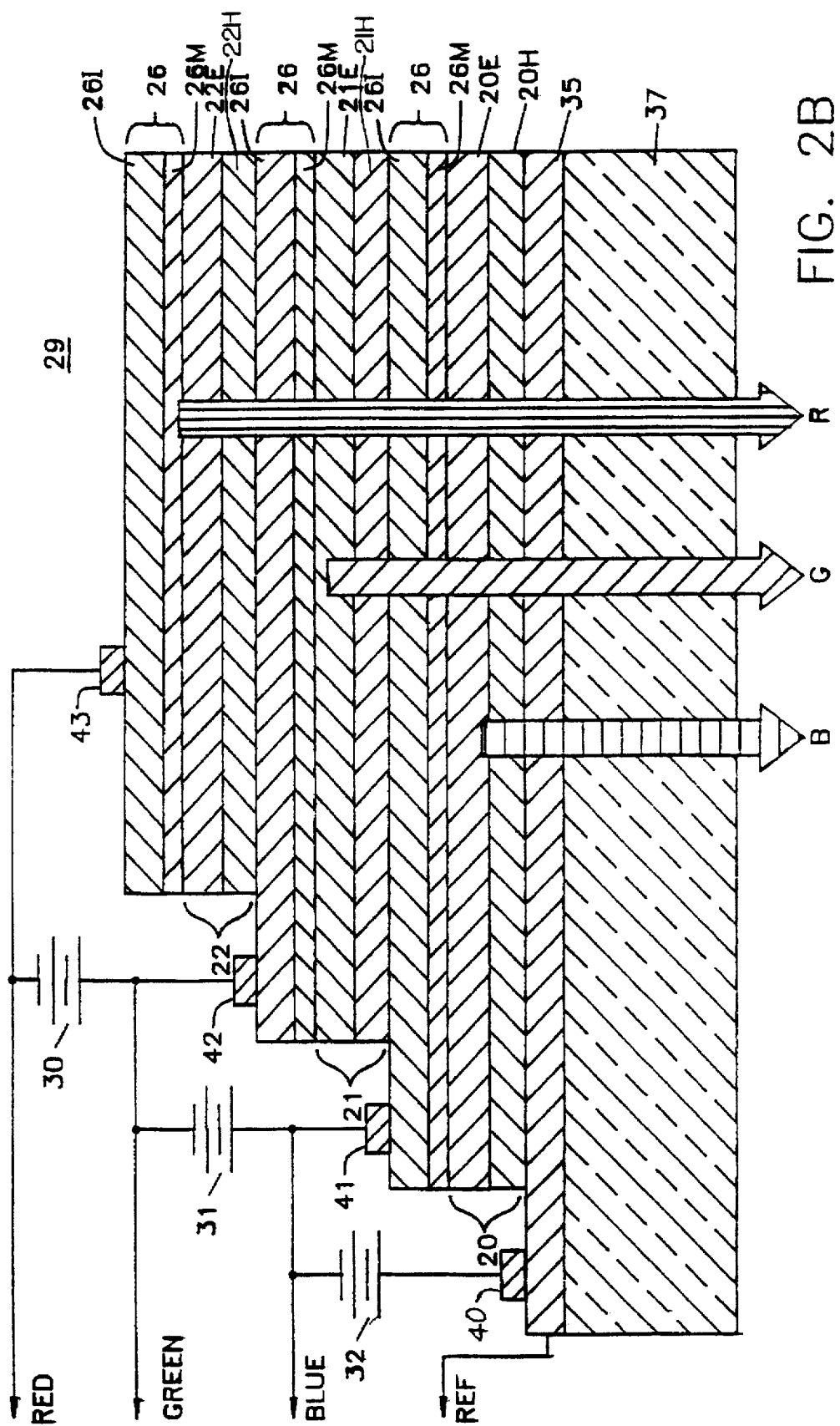

If SH LED devices are used for providing LED's 20, 21, 22, rather than DH LED devices, the ETL and EL layers are provided by a single layer, such as layer 13, as previously described for the SH of FIG. 1B. This layer 13 is typically Al-quinolate. This is shown in FIG. 2B, where the EL layers 20E, 21E, and 22E, respectively, provide both the EL and ETL layer functions. However, an advantage of the DH LED stack of FIG. 2A, relative to a SH LED stack of FIG. 2B, is that the DH LED stack permits thinner overall construction with high efficiency.

In FIGS. 2A and 2B, even though the centers of each of the LED's are offset from one another, the total beam of light from each device is substantially coincident between LED's 20, 21 and 22. While the beams of light are coincident in the concentric configuration, the emitting or non-emitting device closer to the glass substrate will be transparent to the emitting device or devices further away from the glass substrate. However, the diodes 20, 21 and 22 need not be offset from one another and may alternatively be stacked concentrically upon each other, whereupon the beam of light from each device is wholly coincident with the others. A concentric configuration is shown in FIG. 12E which will be described below in regard to device fabrication processes. Note that there is no difference in function between the offset and concentric configurations. Each device emits light through glass substrate 37 in a substantially omnidirectional pattern. The voltages across the three LED's in the stack 29 are controlled to provide a desired resultant emission color and brightness for the particular pixel at any instant of time. Thus, each LED as 22, 21 and 20 can be energized simultaneously with beams as R, G and B, respectively, for example, directed through and visible via the transparent layers, as shown schematically in FIGS. 2A and 2B. Each DH structure 20, 21 and 22 is capable upon application of a suitable bias voltage of emitting a different color light. The double heterostructure LED 20 emits blue light. The double heterostructure LED 21 emits green light while the double heterostructure (DH) LED 22 emits red light. Different combinations or individual ones of LED's 20, 21 and 22 can be activated to selectively obtain a desired color of light for the respective pixel partly dependent upon the magnitude of current in each of the LED's 20, 21 and 22.

In the example of FIGS. 2A and 2B, LED's 20, 21 and 22 are forward biased by batteries 32, 31 and 30, respectively. Current flows from the positive terminal of each battery 32, 31 and 30, into the anode terminals 40, 41, 42, respectively, of its associated LED 20, 21 and 22, respectively, through the layers of each respective device, and from terminals 41, 42 and 43, serving as cathode terminals to negative terminals of each battery 32, 31, and 30, respectively. As a result, light is emitted from each of the LED's 20, 21 and 22. The LED devices 20, 21 and 22 are made selectively energizable by including means (not shown) for selectively switching batteries 32, 31 and 30, respectively, into and out of connection to their respective LED.

In the embodiments of the invention, relative to FIGS. 2A and 2B, the top ITO contact 26I for LED 22 is transparent, making the three color device shown useful for heads-up display applications. However, in another embodiment of the invention, the top contact 26I is formed from a thick metal, such as either Mg/Ag, In, Ag, or Au, for reflecting light emitted upward back through substrate 13, for substantially increasing the efficiency of the device. Also, overall device efficiency can be increased by forming a multilayer dielectric thin film coating between glass substrate 37 and the ITO layer 35, to provide an anti-reflecting surface. Three sets of anti-reflecting layers are required, one to form an anti-reflection coating at each wavelength emitted from the various layers.

Figure 2C:
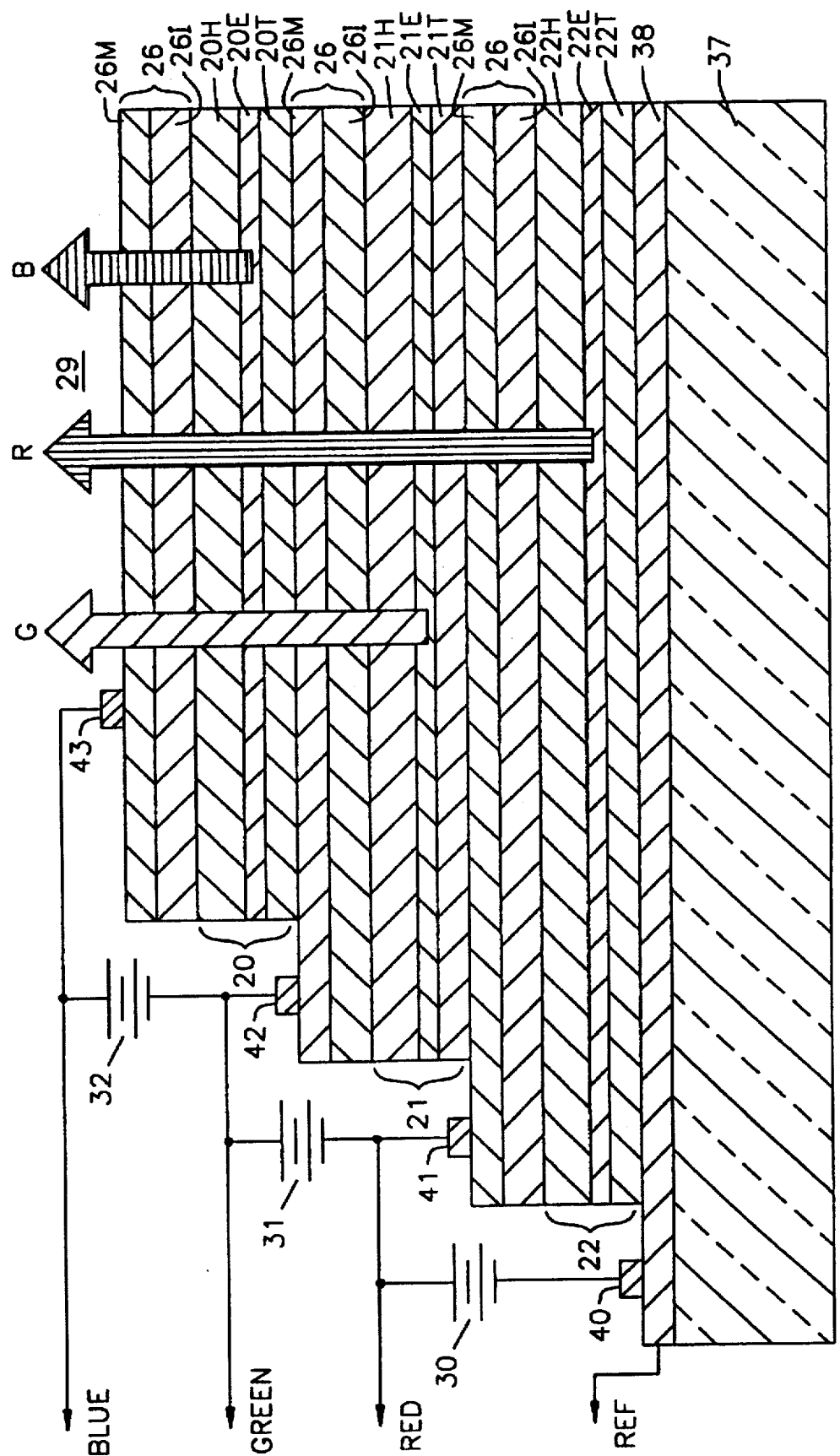

In another embodiment, the device of FIG. 2A is constructed in an opposite or inverted manner, for providing light emission out of the top of stack rather than the bottom as the former. An example of an inverted structure, with reference to FIG. 2C, is to replace ITO layer 35 with a thick, reflective metal layer 38. Blue LED 20 is then provided by interchanging HTL layer 20H and ETL layer 20T, with EL layer 20E remaining sandwiched between the latter two layers. Furthermore, the metal contact layer 26M is now deposited on top of ITO layer 26I. The green LED 21 and red LED 22 portions of the stack are each constructed with inverted layers (the HTL and ETL layers of each are interchanged, followed by inverting the metal and ITO layers) as described for the inverted blue LED 20. Note that in the inverted structure, the blue device 20 must be on top and the red device 22 on the bottom. Also, the polarities of batteries 30, 31, and 32 are reversed. As a result, the current flow through devices 20, 21 and 22, respectively, is in the same direction relative to the embodiment of FIG. 2A, when forward biased for emitting light.

The device in the cross sectional view has a step-like or staircase profile, in this example. The transparent contact areas (ITO) 26I permit separate biasing of each pixel element in the stack and furthermore the material can be used as an etch stop during the processing steps. The separate biasing of each DH LED structure 20, 21 and 22 allows for wavelength tuning of the pixel output to any of various desired colors of the visible spectrum as defined in the CIE (Commission Internationale de l'Eclairage/International Commission of Illumination) chromaticity standard. The blue emitting LED 20 is placed at the bottom of the stack and it is the largest of the three devices. Blue is on the bottom because it is transparent to red and green light. Finally, the materials "partitioning" using the transparent ITO/metal layers 26 facilitates manufacture of this device as will be described. It is the very unique aspects of the vacuum growth and fabrication processes associated with organic compounds which makes the pixel LED devices shown in FIGS. 2A, 2B, and 2C possible. The vertical layering shown in FIGS. 2A, 2B, and 2C allows for the fabrication of three color pixels with the smallest possible area, hence, making these ideal for high definition displays.

As seen in FIGS. 2A, 2B, and 2C, each device DH structure 20, 21 and 22 can emit light designated by arrows B, G and R, respectively, either simultaneously or separately. Note that the emitted light is from substantially the entire transverse portion of each LED 20, 21 and 22, whereby the R, G, and B arrows are not representative of the width of the actual emitted light, respectively. In this way, the addition or subtraction of colors as R, G and B is integrated by the eye causing different colors and hues to be perceived. This is well known in the field of color vision and display colorimetry. In the offset configuration shown, the red, green and blue beams of light are substantially coincident. Any one of a variety of colors can be produced from the stack, and it will appear as one color originating from a single pixel.

The organic materials used in the DH structures are grown one on top of the other or are vertically stacked with the longest wavelength device 22 indicative of red light on the top and the shortest wavelength element 20 indicative of blue light on the bottom. In this manner, one minimizes light absorption in the pixel or in the devices. Each of the DH LED devices are separated by ITO/metal layers 26 (specifically, semitransparent metal layers 26M, and indium tin oxide layers 26I). The ITO layers 26I can further be treated by metal deposition to provide distinct contact areas on the exposed ITO surfaces, such as contacts 40, 41, 42 and 43. These contacts 40, 41, 42 and 43 are fabricated from indium, platinum, gold, silver or alloys such as Ti/Pt/Au, Cr/Au, or Mg/Ag, for example. Techniques for deposition of contacts using conventional metal deposition or vapor deposition are well known. The contacts, such as 40, 41, 42 and 43, enable separate biasing of each LED in the stack. The significant chemical differences between the organic LED materials and the transparent electrodes 26I permits the electrodes to act as etch stop layers. This allows for the selective etching and exposure of each pixel element during device processing.

Each LED 20, 21, 22 has its own source of bias potential, in this example shown schematically as batteries 32, 31, and 30, respectively, which enables each LED to emit light. It is understood that suitable signals can be employed in lieu of the batteries 30, 31, 32, respectively. As is known, the LED requires a minimum threshold voltage to emit light (each DH LED) and hence this activating voltage is shown schematically by the battery symbol.

The EL layers 20E, 21E, 22E may be fabricated from organic compounds selected according to their ability to produce all primary colors and intermediates thereof. The organic compounds are generally selected from trivalent metal quinolate complexes, trivalent metal bridged quinolate complexes, Schiff base divalent metal complexes, tin (iv) metal complexes, metal acetylacetonate complexes, metal bidentate ligand complexes, bisphosphonates, divalent metal maleonitriledithiolate complexes, molecular charge transfer complexes, aromatic and heterocyclic polymers and rare earth mixed chelates, as described hereinafter.

Figure 3:
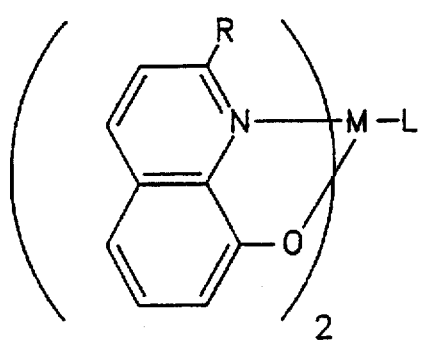
FIGS. 3–11 show a variety of organic compounds which may be used to comprise the active emission layers for generating the various colors.

The trivalent metal quinolate complexes are represented by the structural formula shown in FIG. 3, wherein M is a trivalent metal ion selected from Groups 3—14 of the Periodic Table and the Lanthanides $Al^{+3}$, $Ga^{+3}$ and $In^{+3}$ are the preferred trivalent metal ions.

R of FIG. 3 includes hydrogen, substituted and unsubstituted alkyl, aryl and heterocyclic groups. The alkyl group may be straight or branched chain and preferably has from 1 to 8 carbon atoms. Examples of suitable alkyl groups are methyl and ethyl. The preferred aryl group is phenyl and examples of the heterocyclic group for R include pyridyl, imidazole, furan and thiophene.

The alkyl, aryl and heterocyclic groups of R may be substituted with at least one substituent selected from aryl, halogen, cyano and alkoxy, preferably having from 1 to 8 carbon atoms. The preferred halogen is chloro.

The group L of FIG. 3 represents a ligand including picolylmethylketone, substituted and unsubstituted salicylaldehyde (e.g. salicylaldehyde substituted with barbituric acid), a group of the formula R(O)CO— wherein R is as defined above, halogen, a group of the formula RO— wherein R is as defined above, and quinolates (e.g. 8-hydroxyquinoline) and derivatives thereof (e.g. barbituric acid substituted quinolates). Preferred complexes covered by the formula shown in FIG. 3 are those where M is $Ga^{+3}$ and L is chloro. Such compounds generate a blue emission. When M is $Ga^{+3}$ and L is methyl carboxylate, complexes emitting in the blue to blue/green region are produced. A yellow or red emission is expected by using either a barbituric acid substituted salicylaldehyde or a barbituric acid substituted 8-hydroxyquinoline for the L group. Green emissions may be produced by using a quinolate for the L group.

Figure 4A:
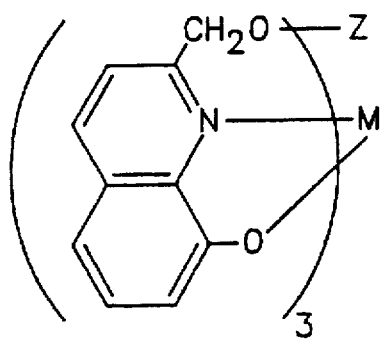
Figure 4B:
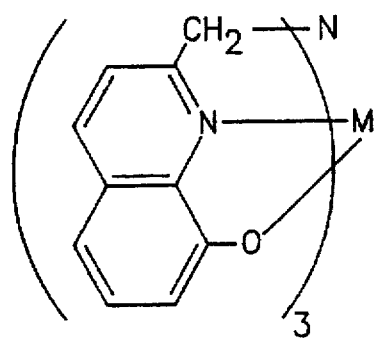

The trivalent metal bridged quinolate complexes which may be employed in the present invention are shown in FIGS. 4A and 4B. These complexes generate green emissions and exhibit superior environmental stability compared to trisquinolates (complexes of FIG. 3 where L is a quinolate) used in prior art devices. The trivalent metal ion M used in these complexes is as defined above with $Al^{+3}$, $Ga^{+3}$, or $In^{+3}$ being preferred. The group Z shown in FIG. 4A has the formula SiR wherein R is as defined above. Z may also be a group of the formula P=O which forms a phosphate.

Figure 5A:
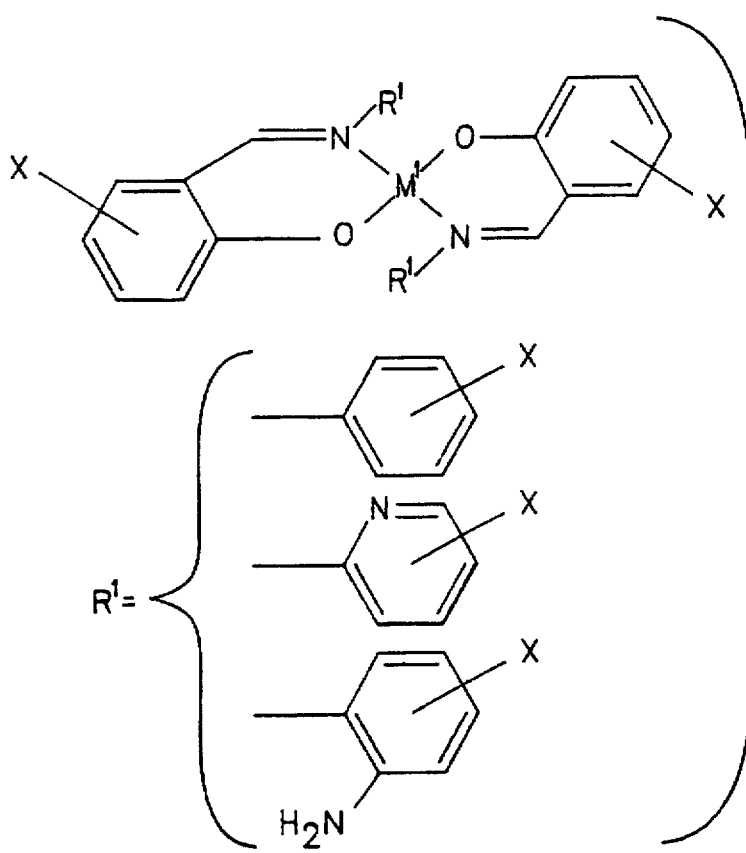
Figure 5B:
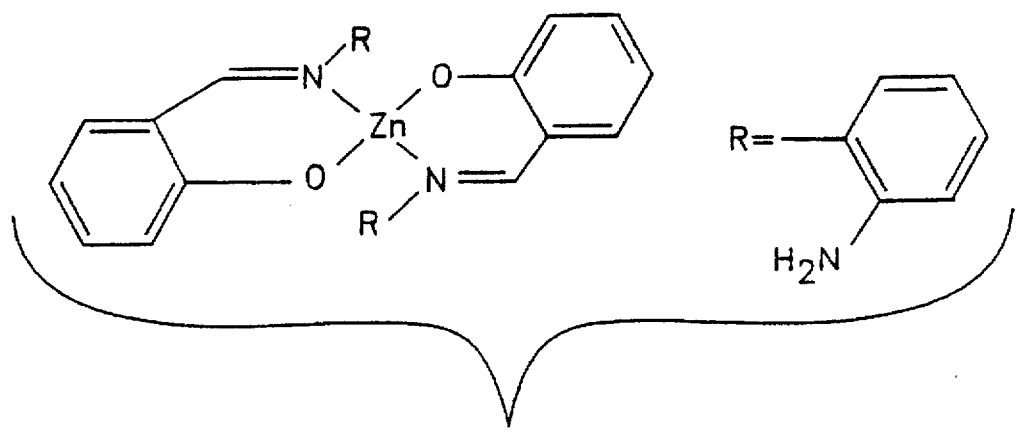

The Schiff base divalent metal complexes include those shown in FIGS. 5A and 5B wherein $M^1$ is a divalent metal chosen from Groups 2–12 of the Periodic Table, preferably Zn (See, Y. Hanada, et al., "Blue Electroluminescence in Thin Films of Axomethin—Zinc Complexes", *Japanese Journal of Applied Physics* Vol. 32, pp. L511–L513 (1993). The group $R^1$ is selected from the structural formulas shown in FIGS. 5A and 5B. The $R^1$ group is preferably coordinated to the metal of the complex through the amine or nitrogen of the pyridyl group. X is selected from hydrogen, alkyl, alkoxy, each having from 1 to 8 carbon atoms, aryl, a heterocyclic group, phosphino, halide and amine. The preferred aryl group is phenyl and the preferred heterocyclic group is selected from pyridyl, imidazole, furan and thiophene. The X groups affect the solubility of the Schiff base divalent metal complexes in organic solvents. The particular Schiff base divalent metal complex shown in FIG. 5B emits at a wavelength of 520 nm.

The tin (iv) metal complexes employed in the present invention in the EL layers generate green emissions. Included among these complexes are those having the formula $SnL^1{}_2L^2{}_2$ where $L^1$ is selected from salicylaldehydes, salicylic acid or quinolates (e.g. 8-hydroxyquinoline). $L^2$ includes all groups as previously defined for R except hydrogen. For example, tin (iv) metal complexes where $L^1$ is a quinolate and $L^2$ is phenyl have an emission wavelength ($\lambda_{em}$) of 504 nm, the wavelength resulting from measurements of photoluminescence in the solid state.

Figure 6:
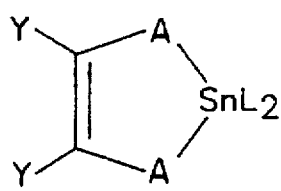

The tin (iv) metal complexes also include those having the structural formula of FIG. 6 wherein Y is sulfur or $NR^2$ where $R^2$ is selected from hydrogen and substituted or unsubstituted, alkyl and aryl. The alkyl group may be straight or branched chain and preferably has from 1 to 8 carbon atoms. The preferred aryl group is phenyl. The substituents for the alkyl and aryl groups include alkyl and alkoxy having from 1 to 8 carbon atoms, cyano and halogen. $L^3$ may be selected from alkyl, aryl, halide, quinolates (e.g. 8-hydroxyquinoline), salicylaldehydes, salicylic acid, and maleonitriledithiolate ("mnt"). When A is S and Y is CN and $L^3$ is "mnt" an emission between red and orange is expected.

Figure 7:
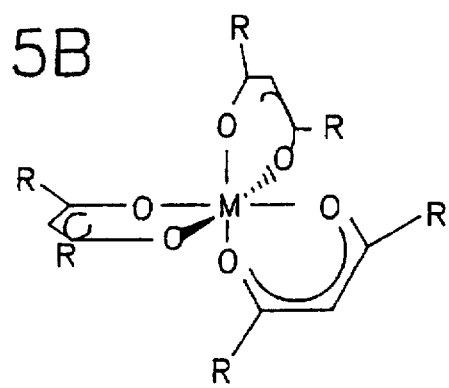

The M (acetylacetonate)$_3$ complexes shown in FIG. 7 generate a blue emission. The metal ion M is selected from trivalent metals of Groups 3–13 of the Periodic Table and the Lanthanides. The preferred metal ions are $Al^{+3}$, $Ga^{+3}$ and $In^{+3}$. The group R in FIG. 7 is the same as defined for R in FIG. 3. For example, when R is methyl, and M is selected from $Al^{+3}$, $Ga^{+3}$ and $In^{+3}$, respectively, the wavelengths resulting from the measurements of photoluminescence in the solid state is 415 nm, 445 nm and 457 nm, respectively (See J. Kido et al., "Organic Electroluminescent Devices using Lanthanide Complexes", *Journal of Alloys and Compounds*, Vol. 92, pp. 30–33(1993).

The metal bidentate complexes employed in the present invention generally produce blue emissions.

Figure 8A:
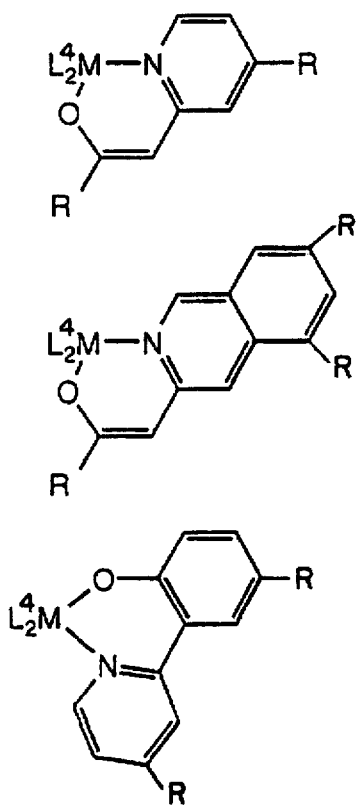
Figure 8B:
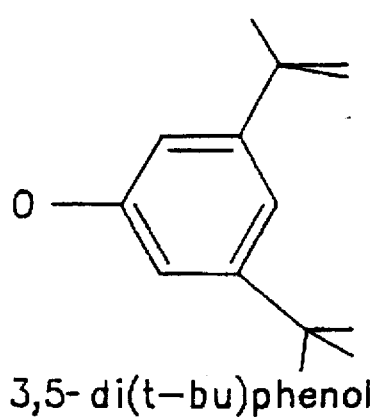
Figure 8C:
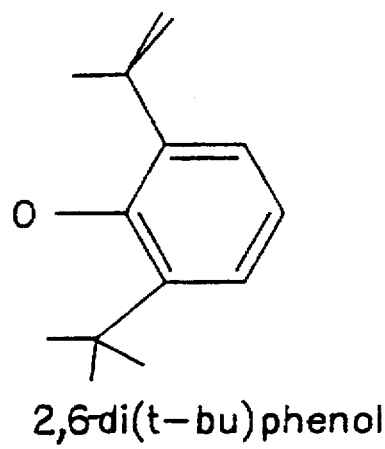
Figure 8D:
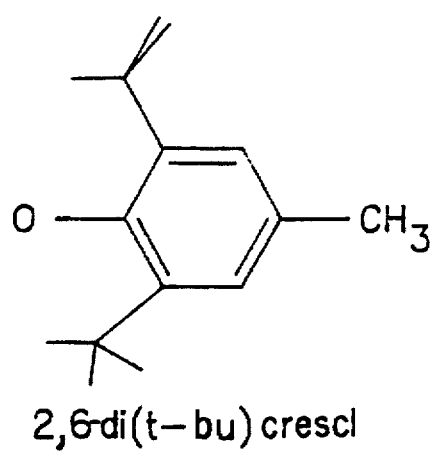
Figure 8E:
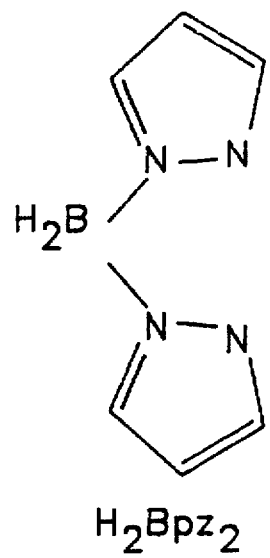

Such complexes have the formula $MDL^4_2$ wherein M is selected from trivalent metals of Groups 3–13 of the Periodic Table and the Lanthanides. The preferred metal ions are $Al^{+3}$, $Ga^{+3}$, $In^{+3}$ and $Sc^{+3}$. D is a bidentate ligand examples of which are shown in FIG. 8A. More specifically, the bidentate ligand D includes 2-picolylketones, 2-quinaldylketones and 2-(o-phenoxy) pyridine ketones where the R groups in FIG. 8A are as defined above.

The preferred groups for $L^4$ include acetylacetonate; compounds of the formula $OR^3R$ wherein $R^3$ is selected from Si, C and R is selected from the same groups as described above; 3, 5-di(t-bu) phenol; 2, 6-di(t-bu) phenol; 2, 6-di(t-bu) cresol; and $H_2Bpz_2$, the latter compounds being shown in FIGS. 8B–8E, respectively.

By way of example, the wavelength ($\lambda_{em}$) resulting from measurement of photoluminescence in the solid state of aluminum (picolymethylketone) bis [2, 6-di(t-bu) phenoxide] is 420 nm. The cresol derivative of the above compound also measured 420 nm. Aluminum (picolylmethylketone) bis $(OSiPh_3)$ and scandium (4-methoxy-picolylmethylketone) bis (acetylacetonate) each measured 433 nm, while aluminum [2-(O-phenoxy) pyridine] bis [2, 6-di(t-bu) phenoxide] measured 450 nm.

Bisphosphonate compounds are another class of compounds which may be used in accordance with the present invention for the EL layers. The bisphosphonates are represented by the general formula:

$$M^2_x(O_3P\text{-organic-}PO_3)_y$$

$M^2$ is a metal ion. It is a tetravalent metal ion (e.g. $Zr^{+4}$, $Ti^{+4}$ and $Hf^{+4}$ when x and y both equal 1. When x is 3 and y is 2, the metal ion $M^2$ is in the divalent state and includes, for example, $Zn^{+2}$, $Cu^{+2}$ and $Cd^{+2}$. The term "organic" as used in the above formula means any aromatic or heterocyclic fluorescent compound that can be bifunctionalized with phosphonate groups.

Figure 9A:
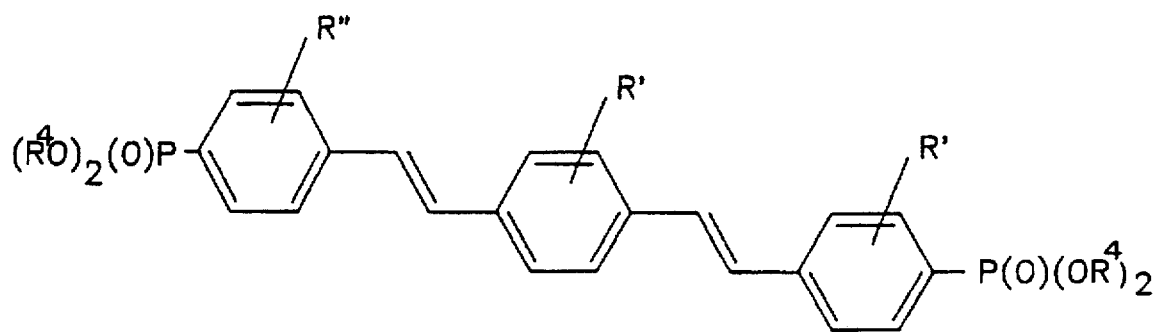
Figure 9B:
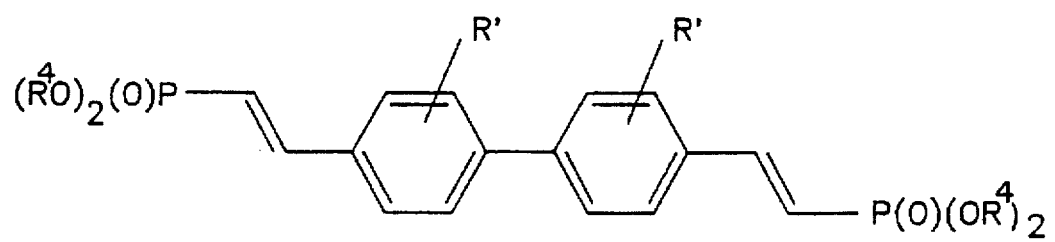

The preferred bisphosphonate compounds include phenylene vinylene bisphonsphonates as for example those shown in FIGS. 9A and 9B. Specifically, FIG. 9A shows β-styrenyl stilbene bisphosphonates and FIG. 9B shows 4, 4'-biphenyl di(vinylphosphonates) where R is as described previously and $R^4$ is selected from substituted and unsubstituted alkyl groups, preferably having 1–8 carbon atoms, and aryl. The preferred alkyl groups are methyl and ethyl. The preferred aryl group is phenyl. The preferred substituents for the alkyl and aryl groups include at least one substituent selected from aryl, halogen, cyano, alkoxy, preferably having from 1 to 8 carbon atoms.

Figure 10:
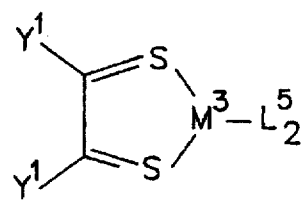

The divalent metal maleonitriledithiolate ("mnt") complexes have the structural formula shown in FIG. 10. The divalent metal ion $M^3$ includes all metal ions having a +2 charge, preferably transition metal ions such as $Pt^{+2}$, $Zn^{+2}$ and $Pd^{+2}$. $Y^1$ is selected from cyano and substituted or unsubstituted phenyl. The preferred substituents for phenyl are selected from alkyl, cyano, chloro and 1, 2, 2-tricyanovinyl.

$L^5$ represents a group having no charge. Preferred groups for $L^5$ include $P(OR)_3$ and $P(R)_3$ where R is as described above or $L^5$ may be a chelating ligand such as, for example, 2,2'-dipyridyl; phenanthroline; 1,5-cyclooctadiene; or bis (diphenylphosphino)methane.

Illustrative examples of the emission wavelengths of various combinations of these compounds are shown in Table 1, as derived from C. E. Johnson et al., "Luminescent Iridium(I), Rhodium(I), and Platinum(II) Dithiolate Complexes", *Journal of the American Chemical Society*, Vol. 105, pg. 1795(1983).

TABLE 1

| Complex | Wavelength* |
|---|---|
| [Platinum(1,5-cyclooctadiene)(mnt)] | 560 nm |
| [Platinum(P(OEt)₃)₂(mnt)] | 566 nm |
| [Platinum(P(OPh)₃)₂(mnt)] | 605 nm |
| [Platinum(bis(diphenylphosphino)methane)(mnt)] | 610 nm |
| [Platinum(PPh₃)₂(mnt)] | 652 nm |

*wavelength resulting from measurement of photoluminescence in the solid state.

Figure 11A:
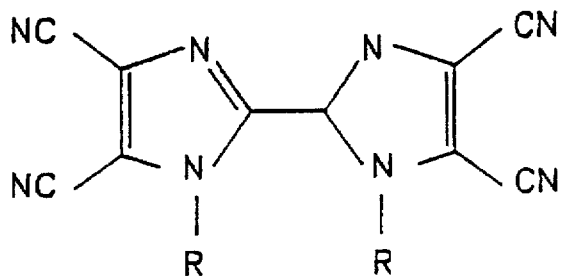
Figure 11B:
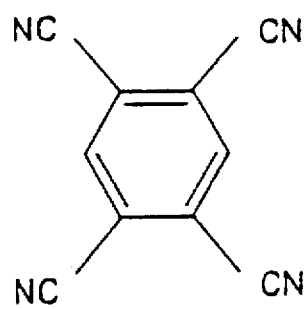
Figure 11C:
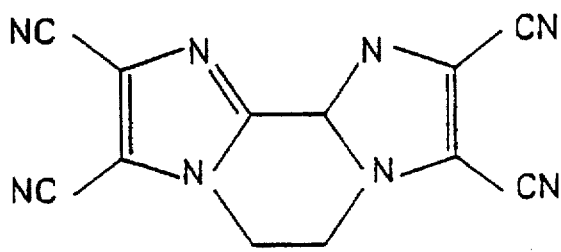
Figure 11D:
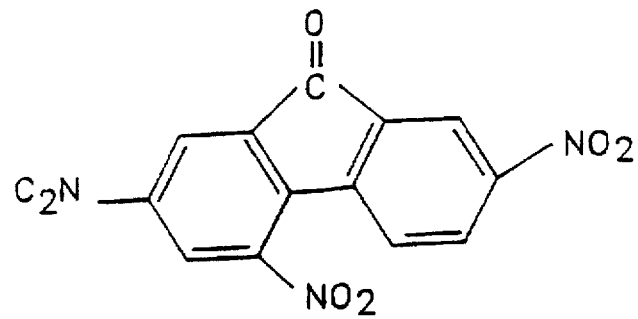
Figure 11E:
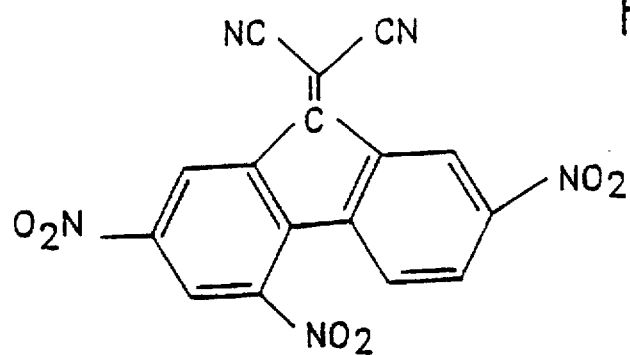
Figure 11F:
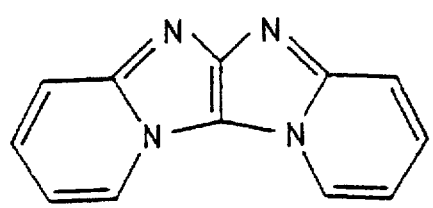
Figure 11G:
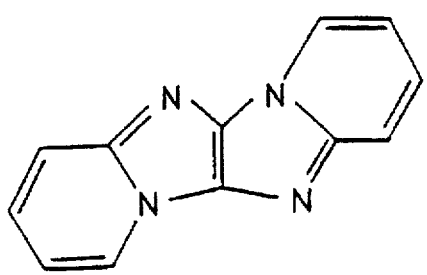
Figure 11H:
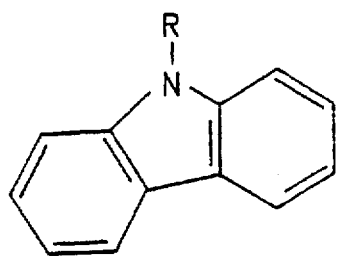
Figure 11I:
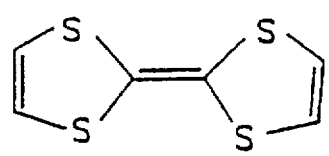
Figure 11J:
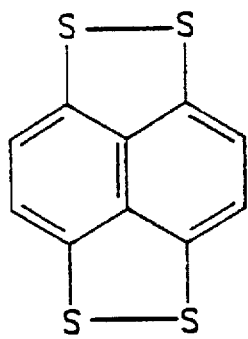

Molecular charge transfer complexes employed in the present invention for the EL layers are those including an electron acceptor structure complexed with an electron donor structure. FIGs. 11A–11E show a variety of suitable electron acceptors which may form a charge transfer complex with one of the electron donor structures shown in FIGS. 11F–11J. The group R as shown in FIGS. 11A and 11H is the same as described above.

Films of these charge transfer materials are prepared by either evaporating donor and acceptor molecules from separate cells onto the substrate, or by evaporating the pre-made charge transfer complex directly. The emission wavelengths may range from red to blue, depending upon which acceptor is coupled with which donor.

Polymers of aromatic and heterocyclic compounds which are fluorescent in the solid state may be employed in the present invention for the EL Layers. Such polymers may be used to generate a variety of different colored emissions. Table II provides examples of suitable polymers and the color of their associated emissions.

TABLE II

| POLYMER | EMISSION COLOR |
|---|---|
| poly(para-phenylenevinylene) | blue to green |
| poly(dialkoxyphenylenevinylene) | red/orange |
| poly(thiophene) | red |
| poly(phenylene) | blue |
| poly(phenylacetylene) | yellow to red |
| poly(N-vinylcarbazole) | blue |

The rare earth mixed chelates for use in the present invention include any lanthanide elements (e.g. La, Pr, Nd, Sm, Eu, and Tb) bonded to a bidentate aromatic or heterocyclic ligand. The bidentate ligand serves to transport carriers (e.g. electrons) but does not absorb the emission energy. Thus, the bidentate ligands serve to transfer energy to the metal. Examples of the ligand in the rare earth mixed chelates include salicyladehydes and derivatives thereof, salicylic acid, quinolates, Schiff base ligands, acetylacetonates, phenanthroline, bipyridine, quinoline and pyridine.

The hole transporting layers 20H, 21H and 22H may be comprised of a porphorinic compound. In addition, the hole transporting layers 20H, 21H and 22H may have at least one hole transporting aromatic tertiary amine which is a compound containing at least one trivalent nitrogen atom that is bonded only to carbon atoms, at least one of which is a member of an aromatic ring. For example, the aromatic tertiary amine can be an arylamine, such as a monoarylamine, diarylamine, triarylamine, or a polymeric arylamine. Other suitable aromatic tertiary amines, as well as all porphyrinic compounds, are disclosed in Tang et al., U.S. Pat. No. 5,294,870, the teachings of which are incorporated herein in their entirety by reference, provided any of such teachings are not inconsistent with any teaching herein.

The fabrication of a stacked organic LED tricolor pixel according to the present invention may be accomplished by either of two processes: a shadow masking process or a dry etching process. Both processes to be described assume, for illustrative purposes, a double heterostructure LED construction, i.e., utilizing only one organic compound layer for each active emission layer, with light emerging from the bottom glass substrate surface. It should be understood that multiple heterojunction organic LEDs having multiple organic compound layers for each active emission layer, and/or inverted structures (with light emerging from the top surface of the stack) can also be fabricated by one skilled in the art making slight modifications to the processes described.

The shadow masking process steps according to the present invention are illustrated in FIGS. 12(A–E). A glass substrate 50 to be coated with a layer of ITO 52 is first cleaned by immersing the substrate 50 for about five minutes in boiling trichloroethylene or a similar chlorinated hydrocarbon. This is followed by rinsing in acetone for about five minutes and then in methyl alcohol for approximately five minutes. The substrate 50 is then blown dry with ultrahigh purity (UHP) nitrogen. All of the cleaning solvents used are preferably "electronic grade". After the cleaning procedure, the ITO layer 52 is formed on substrate 50 in a vacuum using conventional sputtering or electron beam methods.

A blue emitting LED 55 (see FIG. 12B) is then fabricated on the ITO layer 52 as follows. A shadow mask 73 is placed on predetermined outer portions of the ITO layer 52. The shadow mask 73 and other masks used during the shadow masking process should be introduced and removed between process steps without exposing the device to moisture, oxygen and other contaminants which would reduce the operational lifetime of the device. This may be accomplished by changing masks in an environment flooded with nitrogen or an inert gas, or by placing the masks remotely onto the device surface in the vacuum environment by remote handling techniques. Through the opening of mask 73, a 50–100 Å thick hole transporting layer (HTL) 54 and 50–200 Å thick blue emission layer (EL) 56 (shown in FIG. 12B) are sequentially deposited without exposure to air, i.e., in a vacuum. An electron transporting layer (ETL) 58 having a thickness preferably of 50–1000 Å is then deposited on EL 56. ETL 58 is then topped with a semitransparent metal layer 60M which may preferably consist of a 10% Ag in 90% Mg layer, or other low work function metal or metal alloy layer, for example. Layer 60M is very thin, preferably less than 100 Å. Layers 54, 56, 58 and 60M may be deposited by any one of a number of conventional directional deposition techniques such as vapor phase deposition, ion beam deposition, electron beam deposition, sputtering and laser ablation.

An ITO contact layer 60I of about 1000–4000 Å thick is then formed on the metal layer 60M by means of conventional sputtering or electron beam methods. For convenience herein, the sandwich layers 60M and 60I will be referred to and shown as a single layer 60, which is substantially the same as the layer 26 of FIG. 2. The low work function metal portion 60M of each layer 60 directly contacts the ETL layer beneath it, while the ITO layer 60I contacts the HTL layer immediately above it. Note that the entire device fabrication process is best accomplished by maintaining the vacuum throughout without disturbing the vacuum between steps.

Figure 12A:
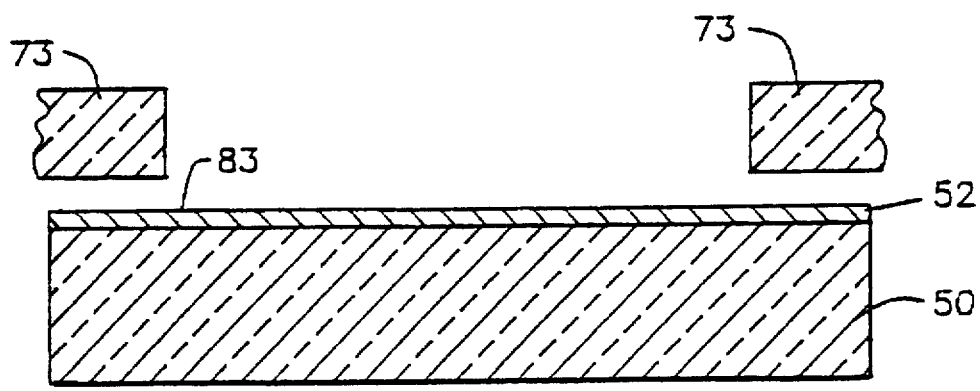
FIGS. 12(A–E) illustrate a shadow masking process for the fabrication of the multicolor LED according to the invention.
Figure 12B:
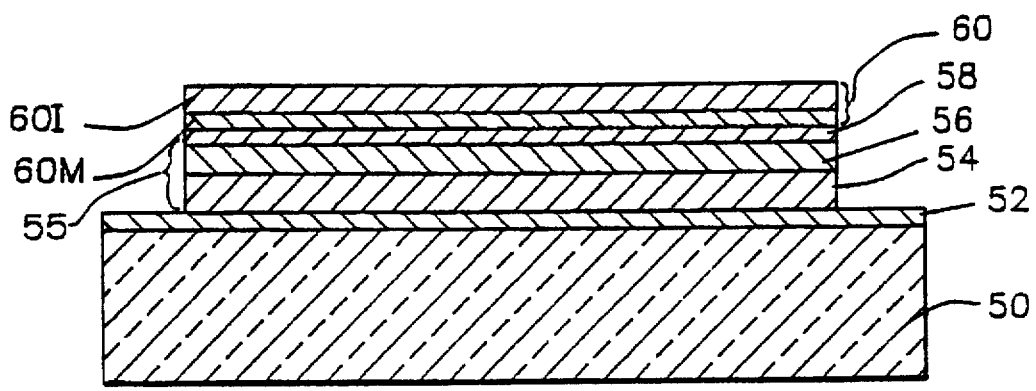
Figure 12C:
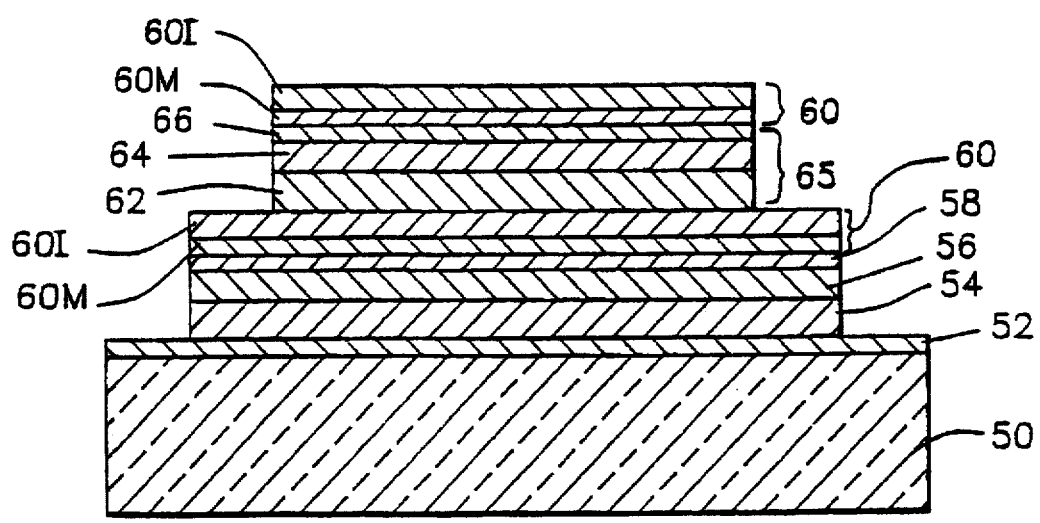

FIG. 12C shows a green emitting LED 65 which is fabricated on top of layer 60 using substantially the same shadow masking and deposition techniques as those used to fabricate blue emitting LED 55. LED 65 comprises HTL 62, green emission layer 64 and ETL 66. A second thin (<100 Å thick, thin enough to be semi-transparent but not so thin to lose electrical continuity) metal layer 60M is deposited on ETL layer 66, followed by another 1000–4000 Å thick ITO layer 60I to form a second sandwich layer 60.

Figure 12D:
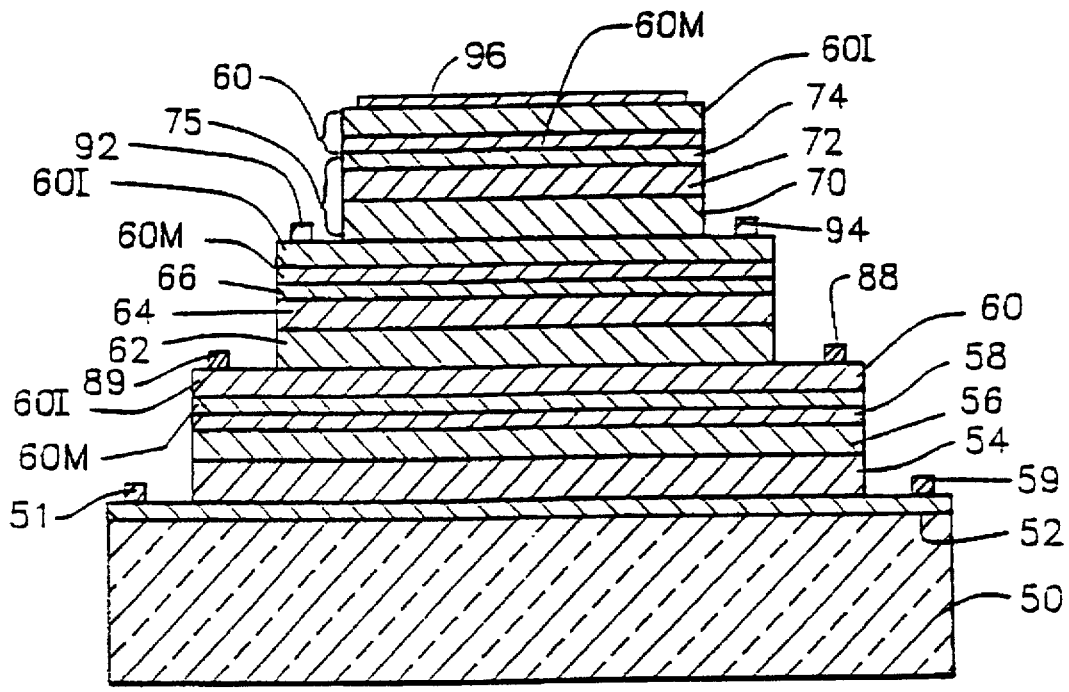
Figure 12E:
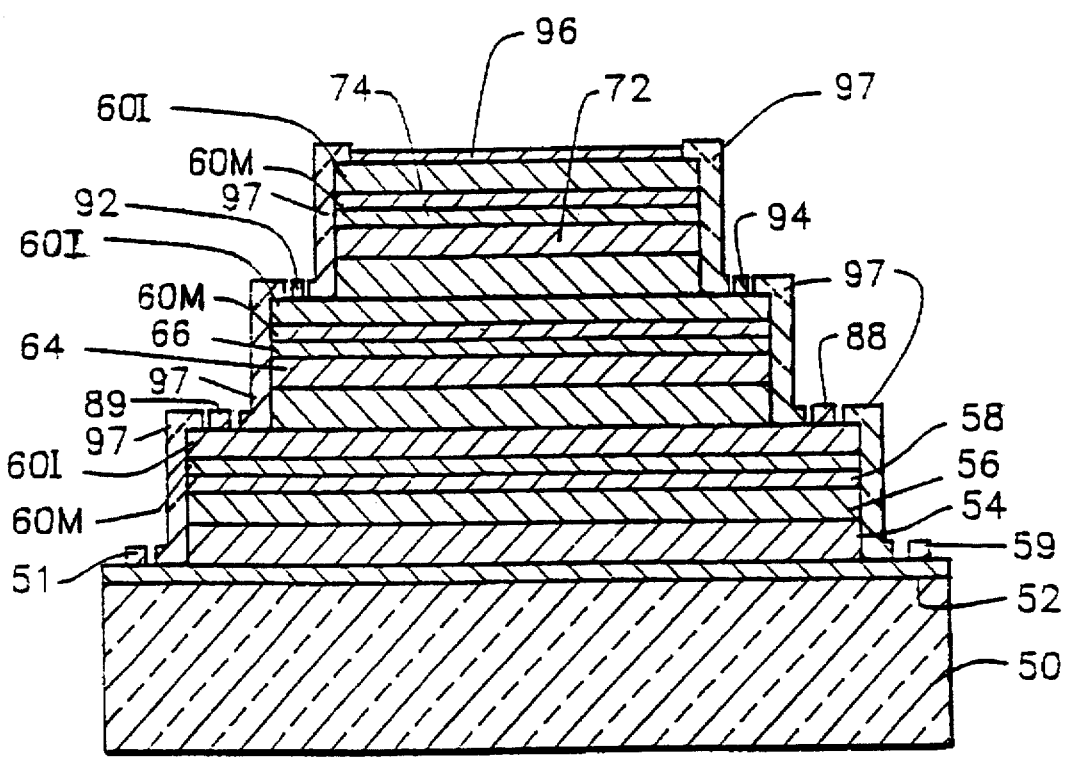

Shown in FIG. 12D is a red emitting LED 75 fabricated upon layer 60 (upon 60I to be specific) using similar shadow masking and metal deposition methods. Red emitting LED 75 consists of a HTL 70, a red emitting EL 72 and ETL 74. A top sandwich layer 60 of layers 60I and 60M are then formed on LED 75. As described above for the embodiment of FIG. 2, similarly, the top transparent ITO layer 60I can in an alternative embodiment be replaced by an appropriate metal electrode serving also to function as a mirror for reflecting upwardly directed light back through the substrate 50, thereby decreasing light losses out of the top of the device. Each ETL layer 74, 66 and 58 has a thickness of 50–200 Å; each HTL layer 54, 62 and 70 is 100–500 Å thick; and each EL layer 56, 64 and 72 is 50–1000 Å thick. For optimum brightness and efficiency, each of the layers including the ITO/metal layers should be kept as close as possible towards the lower end of the above ranges, but these ranges are not meant to be limiting.

The formation of electrical contacts 51 and 59 on ITO layer 52, and electrical contacts 88, 89, 92, 94 and 96 on the ITO portion 60I of ITO/metal layers 60 is then preferably accomplished in one step. These electrical contacts may be indium, platinum, gold, silver or combinations such as Ti/Pt/Au, Cr/Au or Mg/Ag. They may be deposited by vapor deposition or other suitable metal deposition techniques after masking off the rest of the device.

The final step in the shadow masking process is to overcoat the entire device with an insulating layer 97 as shown in FIG. 12E, with the exception of all the metal contacts 51, 59, 88, 89, 92, 94 and 96 which are masked. Insulating layer 97 is impervious to moisture, oxygen and other contaminants thereby preventing contamination of the LEDs. Insulating layer 97 may be $SiO_2$, a silicon nitride such as $Si_2N_3$ or other insulator deposited by electron-beam, sputtering, or pyrolitically enhanced or plasma enhanced CVD. The deposition technique used should not elevate the device temperature above 120° C. inasmuch as these high temperatures may degrade the LED characteristics. Note that the 120° C. is variable, and represents the softening point of typical organic materials used in the present invention.

The dry etching process for fabricating the LED stack according to the invention is illustrated in FIGS. 13(A–F). Referring to FIG. 13A, a glass substrate 102 is first cleaned in the same manner as in the shadow-mask process described above. An ITO layer 101 is then deposited on the glass substrate 102 in a vacuum using conventional sputtering or electron beam methods. An HTL 104, blue EL 105, ETL 106 and sandwich layer comprising metal layer 107M and ITO layer 107I, all of generally the same thicknesses as in the shadow-masking process, are then deposited over the full surface of the ITO layer 101, using either conventional vacuum deposition, or in the case of polymers spin or spray coating techniques. ITO/metal sandwich layer 107 consists of a less than 100 Å thick, low work function metal layer 107M deposited directly on the ETL layer 106, and a 1000–4000 Å thick ITO layer 107I on the metal layer 107M. On the entire top surface of ITO layer 107I, a 1000 Å–2000 Å thick layer of silicon nitride or silicon dioxide masking material 108 is deposited using low temperature plasma CVD. A positive photoresist layer 109 such as HPR 1400 J is then spun-on the silicon nitride layer 108. As shown in FIG. 13B the outer portions 110 (see FIG. 13A) of the photoresist layer 109 are exposed and removed using standard photolithographic processes. The exposed outer portions 110 correspond to the areas where the bottom ITO layer 101 is to be exposed and electrically contacted. Referring to FIG. 13C, the outer regions 111 (defined in FIG. 13B) of the silicon nitride layer 108 corresponding to the removed photoresist areas, are removed using a $CF_4$:$O_2$ plasma. Then, using an ion milling technique or another plasma etch, the exposed outer portions of ITO/metal layers 107I and 107M are removed. An $O_2$ plasma is then employed to sequentially remove the corresponding exposed outer portion of the ETL layer 106, EL layer 105, and HTL layer 104, respectively, and also to remove the remaining photoresist layer 109 shown in FIG. 13D. Finally, a $CF_4$:$O_2$ plasma is again applied to remove the silicon nitride mask 108, with the resulting blue LED configuration shown in FIG. 13D.

Figure 13A:
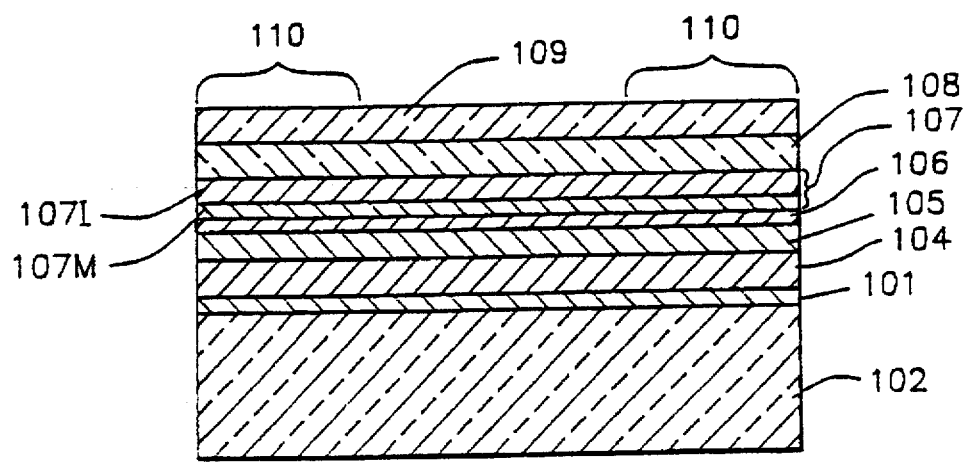
FIGS. 13(A–F) illustrate a dry etching process for the fabrication of the multicolor LED according to the invention.
Figure 13B:
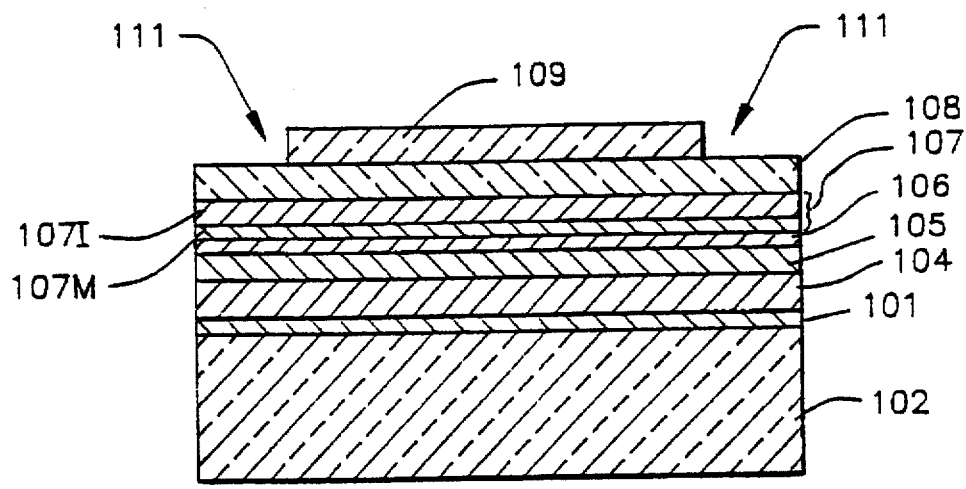
Figure 13C:
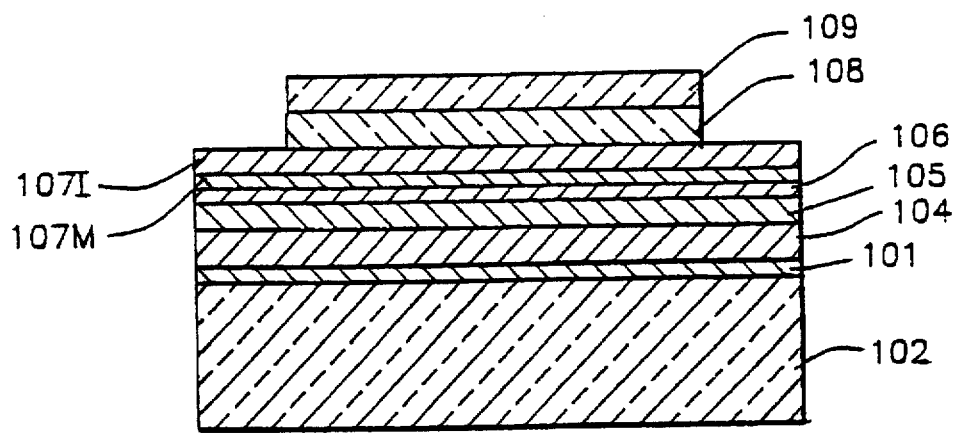
Figure 13D:
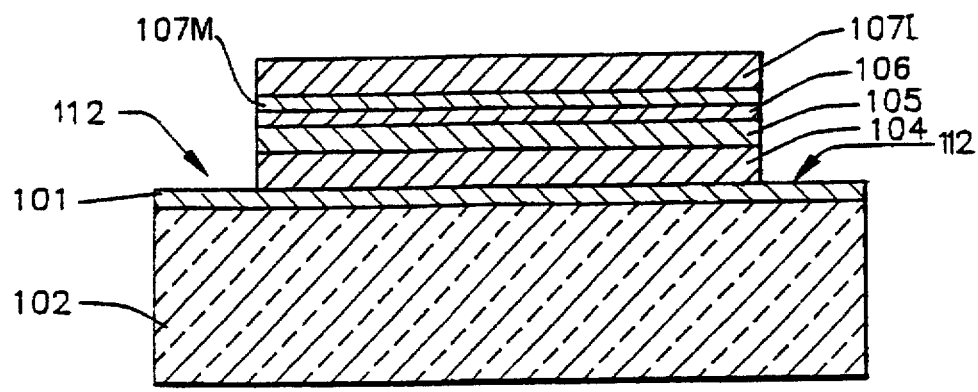
Figure 13E:
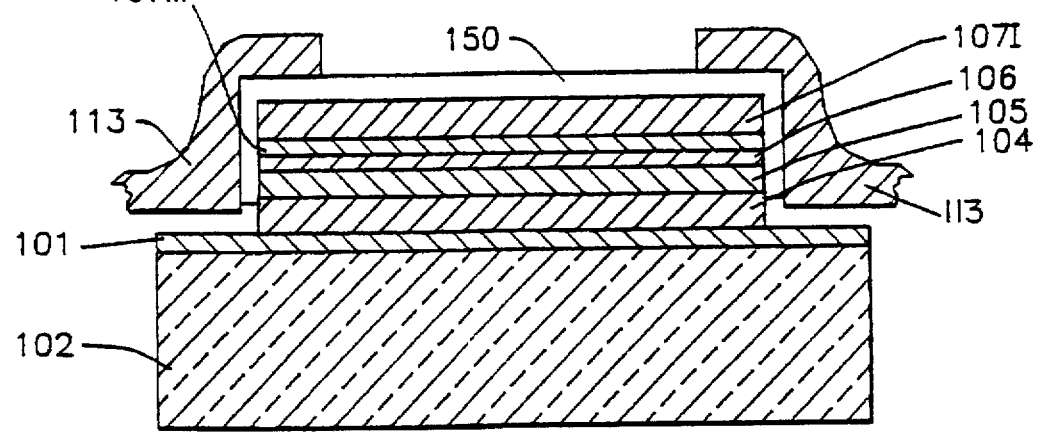

The same sequence of dry etching process steps is used to fabricate a green LED 115 atop the blue LED, except that SiNx 150 is overlaid as shown, followed by a photoresist mask 113 as shown in FIG. 13E to mask the outer portion of ITO layer 101. Then the deposition of HTL layer 114, green EL layer 116, and so on is performed (see FIG. 13F). The same photolithography and etching techniques used for blue LED fabrication are then employed to complete the formation of the green LED 115. The red LED 117 is then formed atop the green LED using substantially the same dry etching process. A passivation layer 119 similar to layer 97 of FIG. 12E is then deposited over the LED stack with suitable patterning to expose electrical contacts, as was described for the shadow masking process. A photoresist mask is used to allow dry etching of holes in passivation layer 119. Next, metal 152 is deposited in the holes. A final photoresist layer and excess metal is removed by a "lift-off" process.

Figure 13F:
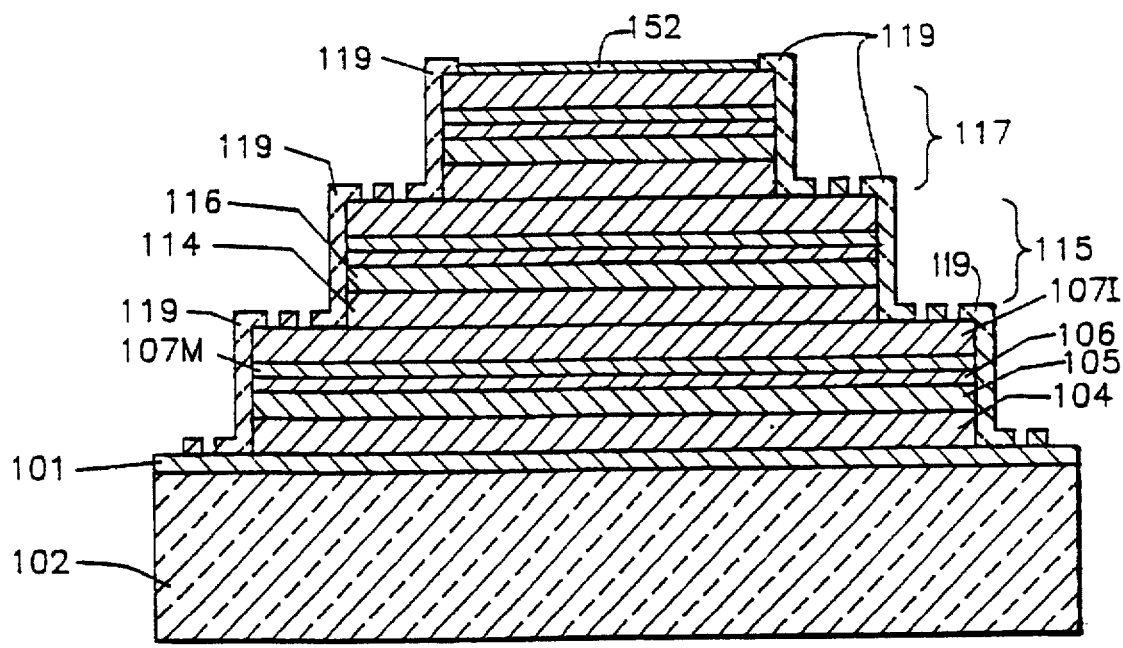
Figure 14A:
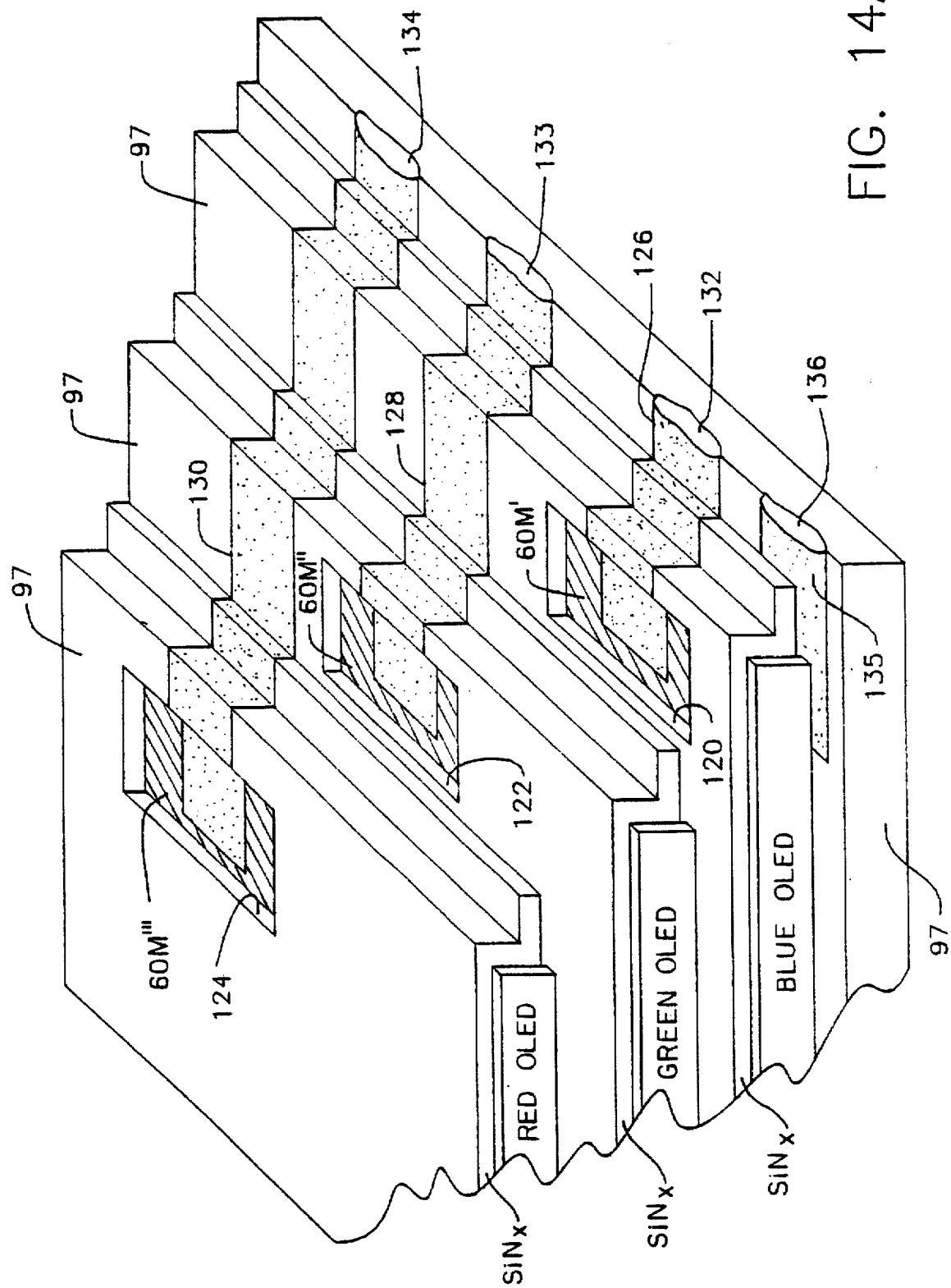
FIG. 14A shows a multicolor LED of one embodiment of this invention configured for facilitating packaging thereof.

Following the LED stack fabrication, whether performed by a shadow mask, dry-etching or other method, the stack must be properly packaged to achieve acceptable device performance and reliability. FIGS. 14(A–C) illustrate embodiments of the invention for facilitating packaging, and for providing a hermetic package for up to four of the multicolor LED devices of the invention, for example. The same reference numerals used in FIGS. 14 (A–B) indicate the identical respective features as in FIG. 12E. The package may also be used with the nearly identical structure of FIG. 13F. Referring to FIG. 14A, after overcoating the entire device with an insulating layer 97, such as SiNx for example, access holes 120, 122, and 124 are formed using known etching/etching/photomasking techniques to expose the topmost metal layers 60M', 60M", and 60M'", for the blue, green, and red LED (organic light emitting diode) devices, respectively, in this example. Thereafter, suitable metal circuit paths 126, 128, and 130 (typically of gold material), are deposited in a path from the exposed metal layers 60M', 60M", and 60M'", respectively, to edge located indium solder bumps 132, 133, and 134, respectively, using conventional processing steps. Similarly, an anode electrode termination is provided via the metal (Au, for example) circuit path 135 formed to have an inner end contacting ITO layer 52, and an outer end terminating at an edge located indium solder bump 136, all provided via conventional processing. The device is then overcoated with additional insulating material such as SiNx to forman insulated covering with solder bumps 132, 133, 134, and 136 being exposed along one edge. In this manner, the organic LED device can be readily packaged using conventional techniques, or the packaging embodiment of the invention as described immediately below.

Figure 14B:
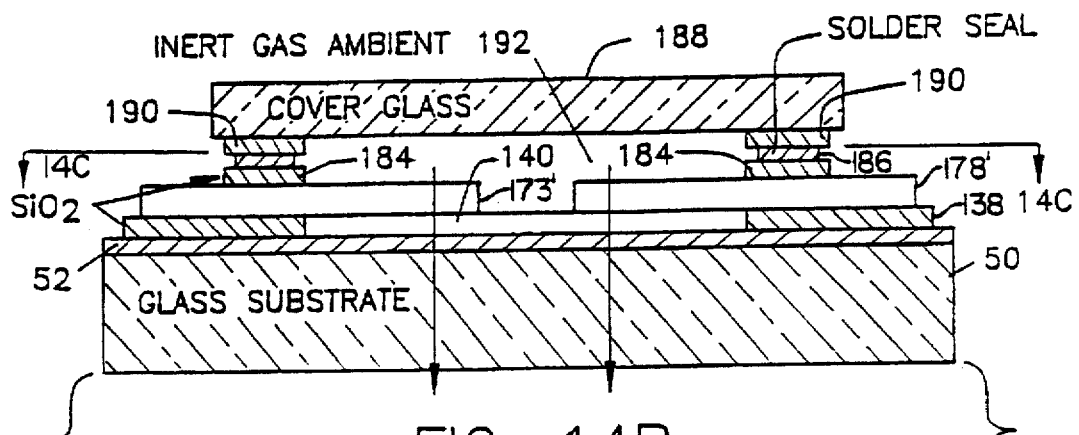
FIG. 14B shows a cross sectional view of a hermetic package for another embodiment of the invention.
Figure 14C:
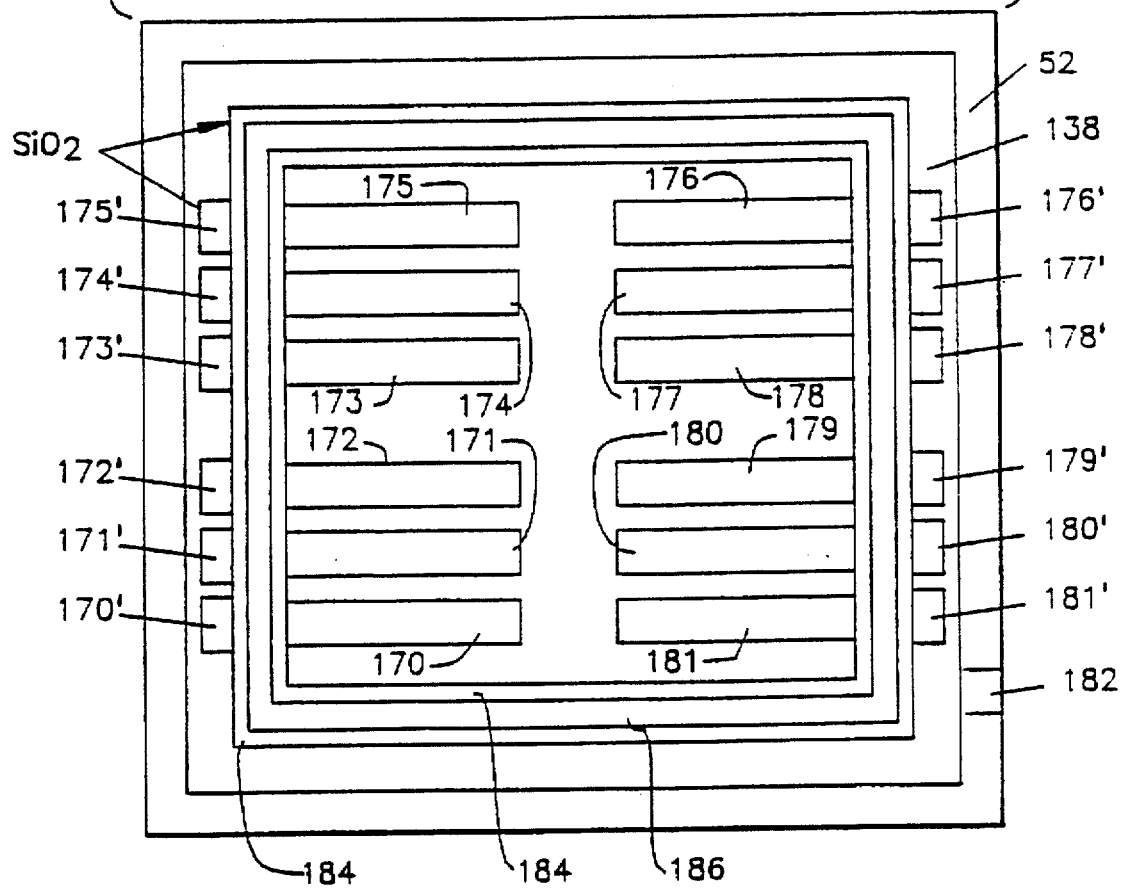
FIG. 14C is cross sectional view taken along 14C—14C of FIG. 14B.

A method for making four multicolor LED devices on a common substrate 50 in a packaged configuration will now be described, with reference to FIGS. 14A, 14B, and 14C, respectively, for another embodiment of the invention. The starting material includes a glass substrate 50 coated with an overlayer of indiumtin oxide (ITO) 52. The following steps are used to obtain the packaged multicolor organic LED array:

1. Mask ITO layer 52 to deposit an $SiO_2$ layer 138 in a concentric square band ring pattern, in this example (some other pattern can be employed), on top of ITO layer 52 using conventional techniques.

2. Form four three-color LED stacks sharing common layers in region 140 on the ITO layer 52 using methods as taught above for obtaining, for example, either of the structures of FIGS. 12E or 13F, and 14A.

3. Deposit via shadow masking metal contacts 170 through 181; each terminating at exterior ends on $SiO_2$ layer 138, for providing external electrical connecting or bonding pads 170' through 181', respectively. Note that contacts 126, 128, and 130 in FIG. 14A are the same as every successive three of contacts 170–181, respectively. Each group of three contacts, namely 170 through 172, 173 through 175,176 through 178, and 179 through 181, terminate at their interior or other ends to provide an electrical connection with the metal layers 60M', 60M", 60M'", respectively, of each of the four organic LED devices, respectively. Another metal contact 182 is deposited via shadow masking on an edge of ITO layer 52 common to all four of the LED devices, for providing a common anode connection, in this example. Note that if through appropriate masking and etching the four LED devices are made in completely independent layers, four anode contacts, respectively, will have to be provided for the latter array so that it can be operated in a multiplexed manner. The multicolor LED array being described in this example is a non-multiplexed array.

4. Deposit via shadow masking using an "L" shaped mask in two steps or via photolithography, for example, a second $SiO_2$ layer 184 in a continuous band or ring leaving exposed bonding pads 170' through 181', using either sputtering, or plasma enhanced CVD, or electron beam deposition, for example.

5. Deposit Pb—Sn or other low temperature melting solder in a continuous band or ring 186 on top of the second $SiO_2$ layer or band 184.

6. Deposit on the bottom of a cover glass 188 a metal ring 190 to be coincident with the solder seal ring 186.

7. Place the assembly in an inert gas atmosphere, such as dry nitrogen, and apply heat to melt solder ring 186 to obtain an air tight seal, with the inert gas trapped in interior region 192.

8. Install cover glass 188 over the assembly, as shown in FIG. 14B, with metal ring 190 abutting against the solder ring 186.

Figure 15:
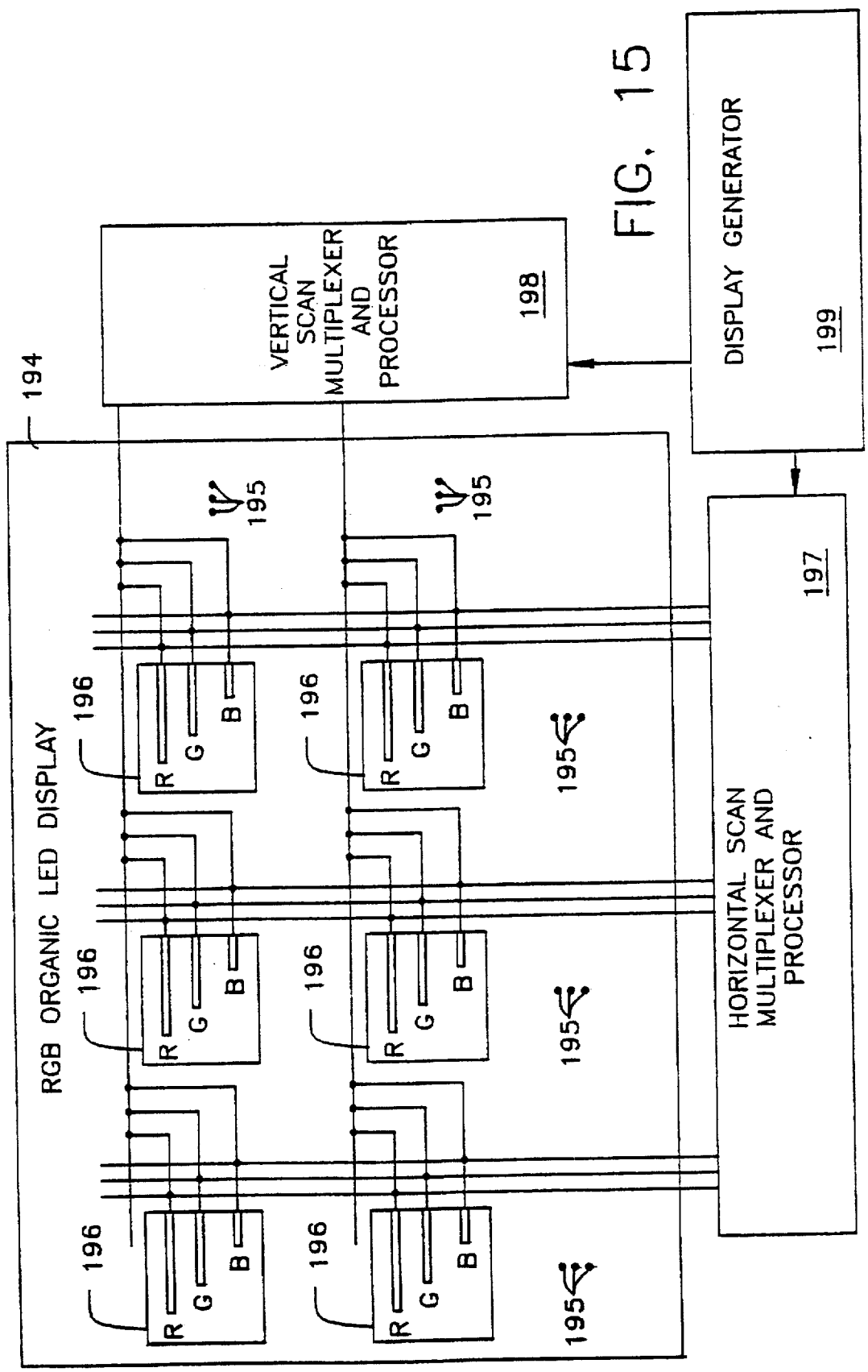
FIG. 15 is a block diagram showing an RGB display utilizing LED devices according to this invention together with display drive circuitry.

Referring to FIG. 15, there is shown a display 194 which is an RGB organic LED display. The dots 195 are ellipsis. A complete display as 194 comprises a plurality of pixels such as 196. The pixels are arranged as a XY matrix to cover the entire surface area of a glass sheet coated with ITO. Each pixel includes a stacked LED structure as that shown in FIG. 2. Instead of having fixed bias means as batteries 30, 31 and 32 (FIG. 2) each of the lines of terminals designated in FIG. 2 as blue (B), green (G) and red (R) are brought out and coupled to suitable horizontal and vertical scan processors 197 and 198, respectively, all under control of a display generator 199 which may be a TV unit. Accordingly, each matrix of LEDs has at least two axes (x,y), and each LED is at the intersection of at least two of the axes. Also, the x-axis may represent a horizontal axis, and the y-axis a vertical axis. It is well known how to convert television signals such as the NTSC signals into the color components R, G and B for color displays. Monitors for computers which utilize red, green and blue for primary colors are also well known. The drive and control of such devices by vertical and horizontal scanning techniques are also known. The entire array of pixel structures deposited over the surface of the display is scanned employing typical XY scanning techniques as using XY addressing. These techniques are used in active matrix displays.

One can use pulse width modulation to selectively energize the red, green and blue inputs of each of the DH LED pixels according to desired signal content. In this manner, each of the LEDs in each line of the display are selectively accessed and addressed and are biasedby many means such as by pulse width modulation signals or by staircase generated voltages to enable these devices to emit single colors or multiple colors, so that light emitted from said structures creates an image having a predetermined shape and color. Also, one can serially scan each of the xy axes, and serially energize selected ones of the LEDs in the matrix to emit light for producing an image with colors created serially vertically. Selected ones of the LEDs may be simultaneously energized.

As indicated above, the vertical layering technique shown in FIG. 2 allows the fabrication of the three color DH LED pixel within extremely small areas. This allows one to provide high definition displays such as displays that have 300 to 600 lines per inch resolution or greater. Such high resolution would be considerably more difficult to obtain using prior art techniques in which the organic emission layers or fluorescent media generating the different colors are laterally spaced from one another.

Based on modern standards one can provide a LED device as shown in FIG. 2 with an effective area small enough to enable hundreds of pixel diodes to be stacked vertically and horizontally within the area of a square inch. Therefore, the fabrication techniques enables one to achieve extremely high resolution with high light intensity.

Figure 16:
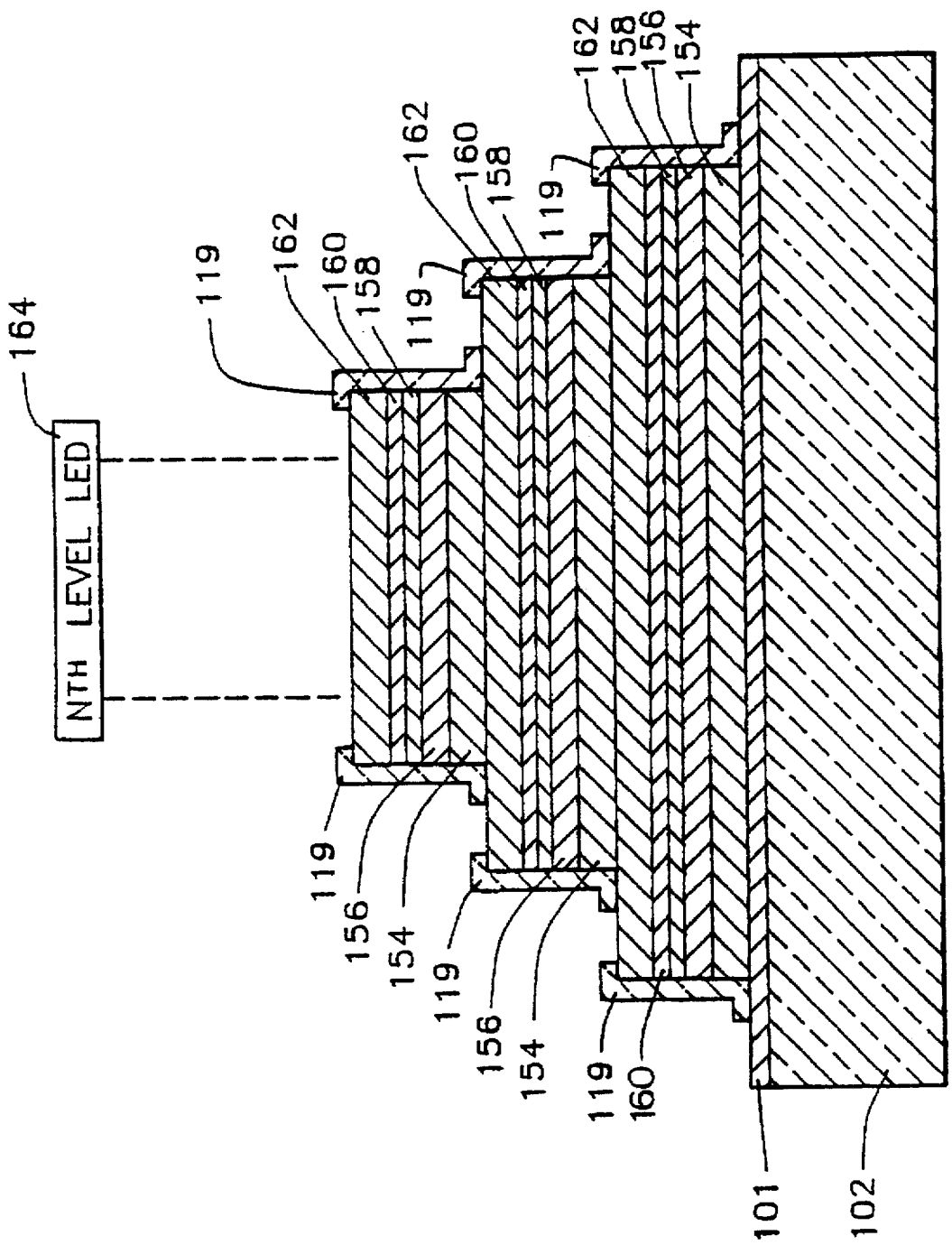
FIG. 16 shows an LED device of another embodiment of the invention extending the number of stacked LED's to N, where N is an integer number 1, 2, 3, . . . N.

In FIG. 16, another embodiment of the invention is shown for a multicolor LED device including the stacking of up to N individual LEDs, where N is an integer number 1,2,3 . . . N. Depending upon the state of the technology at any future time, N will have a practical limit. The stacked N levels of LEDs can, for example, be provided using either the shadow masking process steps previously described for FIGS. 12 (A–E), or the dry etching process illustrated in FIGS. 13A through 13F. The base or bottom portion of the stacked array of FIG. 16 is a glass substrate 102 as shown in FIG. 13F, for example, with an ITO layer 101 formed over substrate 102. The immediately overlying first LED device, and following LED devices in this example, each include in succession over ITO layer 101 an HTL layer 154, an EL layer 156, an ETL layer 158, a metal layer 160, and an ITO layer 162. The $N^{th}$ level LED device 164 further includes a topmost metal layer (see layer 152 of FIG. 13F) formed over the uppermost ITO layer 162 thereof. A passivation layer 119 is deposited over the stack, as in the color stack of FIG. 13F. The material for each EL layer 156 of each LED device is selected for providing a particular color for the associated LED. As in the three color device, shorter wavelength (blue) devices must lie lower in the stack than the longer wavelength (red) devices to avoid optical absorption by the red emitting layers. The color selected for each respective LED and the actual number of stacked LEDs are dependent upon the particular application, and the desired colors and shading capability to be provided. Such multi-color devices can also be used in optical communications networks, where each different optical channel is transmitted using a different wavelength emitted from a given device in the stack. The inherently concentric nature of the emitted light allows for coupling of several wavelengths into a single optical transmission fiber. In practical such stacked arrays, access holes are formed down to the ITO layer 162 of each device followed by the deposition of appropriate metallization for facilitating packaging and electrical connection to each of the LED devices in the stack, in a manner similar to that described for the stacked multicolor LED device of FIGS. 14A, 14B, and 14C, for example.

This device can be used to provide a low cost, high resolution, high brightness full color, flat panel display of any size. This widens the scope of this invention to displays as small as a few millimeters to the size of a building, but to a practical limit. The images created on the display could be text or illustrations in full color, in any resolution depending on the size of the individual LEDs.

The inventors recognized that if the multicolor organic LEDs, as described above relative to the description of FIGS. 1A through 16, are improved to be substantially fully transparent to a user when the OLED devices are de-energized, then such transparent organic light emitting devices (hereinafter TOLED) are directly applicable for use in heads-up displays, and other applications. For purposes of this description, heads-up displays are substantially transparent to a user when deenergized, thereby providing view through capability to the user. When a given one or more of the devices are energized, to emit light in this example, the effected portion of the display would then illuminate an individual or multicolor display via the above-described organic LEDs incorporating the below-described embodiment of the invention. In order to accomplish this, the present inventors conceived methods and apparatus for overcoming the difficulties involved in the prior art in depositing transparent electrical contacts on soft material such as used in organic light emitting devices (OLEDs) without causing damage to the underlying layers, as typically occurs when using known prior processes. The inventors recognize that in overcoming these problems, OLED devices can then be used in heads-up displays that employ a variety of other display technologies, which themselves would benefit from the below-described embodiments of the invention for producing contacts that are substantially transparent to a user. For example, applications that may benefit from the present invention are heads-up displays employed in visors on a motorcyclist helmet, or a jet fighter pilots helmet, each patterned with OLEDs for providing direct view displays for gauges, maps, itinerary, and so forth. Other applications employing such OLED heads-up based displays may also include displays on windshields, teleprompters, and so forth. Video game displays and other type displays may also include OLED's of the present invention.

Accordingly, the embodiments of the invention described below are believed to represent a significant step forward in the state-of-art.

Methods are known for depositing transparent contacts on hard material, or materials that are unaffected by temperatures exceeding about 50° C., such as silicon (Si) used in inorganic solarcells, for example. It should be noted that although the intended benefit of the below-described embodiment of the invention is for use in forming transparent contacts on soft material such as organic layers, the method and apparatus can also be used for depositing transparent contacts on hard materials.

It should be noted that the embodiments of the invention for providing OLED(s) as described above relative to the parent application U.S. Ser. No. 08/354,674, provide devices that have a luminescence band that is substantially red shifted from the absorption band by as much as 0.5 eV (electron volt). As a result, the present OLED(s) are highly transparent over their own emission spectrum and throughout most of the visible spectrum, thereby providing a property not found in inorganic semiconductor light emitters. Through use of the embodiments of the invention as described below for providing substantially transparent contacts, the present inventors have discovered a new class of vacuum-deposited organic luminescence devices which are greater than 71% transparent when de-energized, and are capable of emitting light from top and bottom diode surfaces with high efficiency when energized (approaching or exceeding 1% quantum efficiency).

To accomplish the above-described results, the first problem to be overcome by the inventors was to discover a metal capable of forming a good chemical bond with an underlying organic layer, to provide mechanical stability. It was determined that one such metal can be provided through the use of a metal alloy film of magnesium (Mg) and silver (Ag). However, other metals and/or metal alloy films such as fluorine doped tin oxides, Ca, In, Al, Sm, Y, Yb, MgAl, and various alloys containing these materials other than metal alloy films of Mg:Ag may be applicable for use (see Tang et al. U.S. Pat. No. 5,294,870). Films of Mg:Ag are presently considered to represent a preferred embodiment for the present invention. If the contact consists of a single metal, the metal must have a low work function. When the contact consists of a metal alloy, at least one of the metals must have a low work function. In using Mg:Ag, Mg has a low work function. Also, the chosen metal must insure a good electrical bond with the organic layer, as determined through experimentation with various materials. The good electrical bond ensures the metal contact or electrode will inject a sufficient number of carriers into the organic layer.

After solving the first problem of establishing a metal or metal alloy for providing both a good chemical bond and electrical contact with an underlying organic layer, the next problem for the inventors was to determine how to make the contact transparent while preserving these other properties such as low electrical resistance. It was known that by making the metal layer very thin, a desired transparency for the layer could be obtained. However, the inventors recognized that the layer must be thick enough to protect the underlying organic layer from the required next processing step, in this example, of depositing an indium tin oxide (ITO) layer on top of the metal layer. Also, for example, a thin Mg layer oxidizes quickly, and must be coated with ITO as soon after being formed as possible to protect the Mg layer. Prior processes for doing this are conducted at high temperature and high power deposition, which would damage the underlying organic layer. Accordingly, the inventors conceived a process for depositing the ITO layer on the metal layer at very low power and room temperature, typically 22C. (72F.).

The ITO layer, in addition to being transparent, is also electrically conductive, and therefore reduces the electrical resistance of the multilayer contact formed with the Mg:Ag. The ITO cannot be used by itself for it typically does not provide a good bond with organic material (i.e. it does not stick well to organic material), and typically it is not a good electron injector into the organic electroluminescent material. The Mg:Ag layer, in this example, does provide a good bond to the organic layer and to the ITO, and is a good electron injector.

Figure 17:
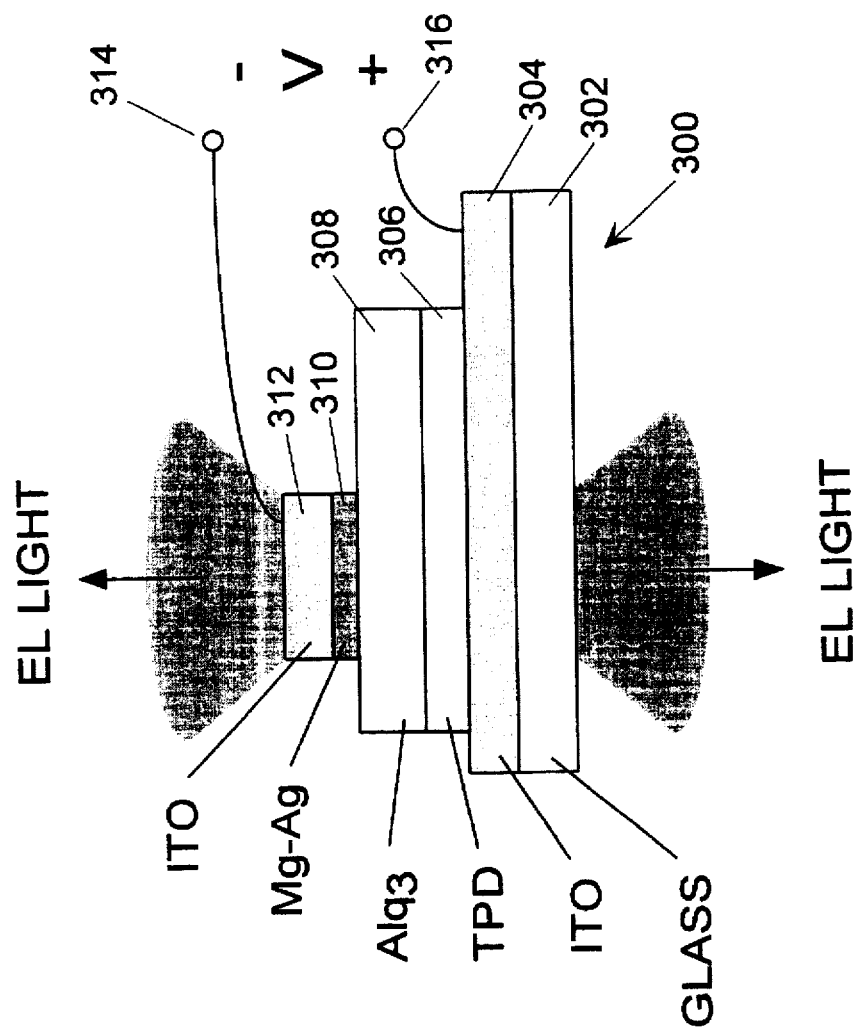
FIG. 17 shows a substantially transparent organic light emitting device (TOLED) for another embodiment of the invention.

In FIG. 17, a cross-sectional view of an engineering prototype produced by the inventors for providing a transparent organic light emitting device (TOLED) is shown. In this example, device 300 is grown on a glass substrate 302 pre-coated with a transparent indium tin oxide (ITO) thin film 304 with a sheet resistivity of typically 20 $\Omega$(ohms)/square, depending on the thickness of the ITO film. Note that although substrate 302 consists of transparent glass, in this example, it can also be provided by any other transparent rigid support on which ITO can be coated, such as plastic material, for example. Also, the ITO film can be replaced by any suitable electrical conducting oxide or a conductive transparent polymer. Prior to deposition of the organic films, the substrate 302 was pre-cleaned using conventional techniques. Deposition was performed by sublimation, in a vacuum of <$10^{-6}$ Torr, of a 200 Å thick layer 306 of the hole conducting compound N,N'-diphenyl-N,N'bis(3-methylphenyl)1-1'biphenyl-4,4'diamine (TPD), followed by a 400 Å thick layer 308 of the electron conducting and highly electroluminescent $Alq_3$ (aluminum tris 8-hydroxyquinoline). A top layer 310 providing an electron-injecting contact to the device 300 was made by deposition through a shadow mask (not shown) of a thin (50 Å–400 Å) semi-transparent Mg—Ag alloy electrode (in an approximate atomic ratio of 40 Mg:1 Ag), for example. Other atomic ratios, such as 50Mg:1Ag, can be used, depending upon the application, but note that the invention is not meant to be limited to any particular ratio or contact metal composition. Finally, the TOLED device 300 is capped by a second 400 Å thick ITO layer 312, sputter-deposited onto the Mg—Ag surface of layer 310. This second ITO layer 312 provides a continuous, transparent conducting surface on top of which a second TOLED can be grown (see above for description of FIGS. 12, 13, and 16). ITO layer 312 is made as thick as possible to reduce resistivity, while retaining acceptable transparency. Electrical contacts 314 (negative polarity) and 316 (positive polarity) are bonded to ITO layers 312 and 304, respectively, using conventional processing.

Figure 18:
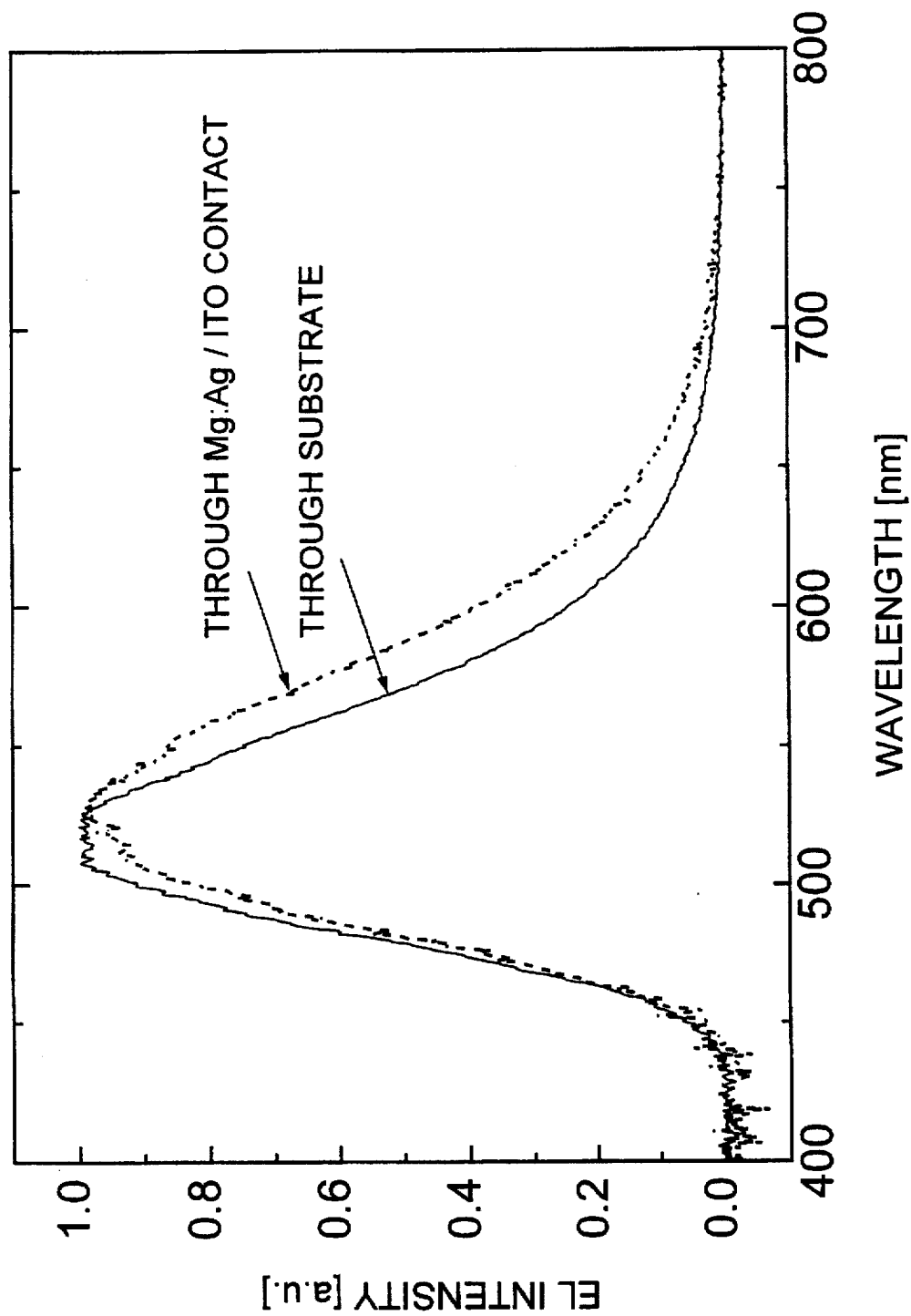
FIG. 18 shows the spectral output of a TOLED emitting from a 100 Å thick Mg—Ag contact (dotted line) and the associated substrate (solid line) as a plot of EL Intensity (a.u.) versus Wavelength (nm), for the embodiment of the invention of FIG. 17.

The output of the device 300 measured from both the top and substrate device surfaces for a TOLED with a 100 Å thick Mg—Ag electrode 310, in this example, is shown in FIG. 18. Typical operating conditions for such TOLED devices 1 mm in diameter are $10^{-4}$A (ampere) and 10V (volts) drive voltage (applied across terminals 314 and 316). The emission spectra from both surfaces are similar to conventional $Alq_3$-based devices described previously (C. W. Tang and S. A. VanSlyke, *Appl. Phys. Lett.*, Vol. 51, 913 (1987); and P. E. Burrows and S. R. Forrest, *Appl. Phys. Lett.*, Vol. 64, 2285 (1993)), although there is a slight (10 nm) shift of the emission toward the red of the light emerging from the top contact relative to the back contact. This may result from differences in the absorption spectrum of the Mg—Ag as compared to the ITO films, and/or absorption due to interfacial states in the Mg—Ag/ITO electrode. The total internal quantum efficiency of light emission from this device 300 example is 0.75%, which is comparable to the efficiency of conventional Alq$_3$-based OLEDs. Approximately 10% higher intensity is emitted through the substrate 302 than from the top contact 312.

Figure 19:
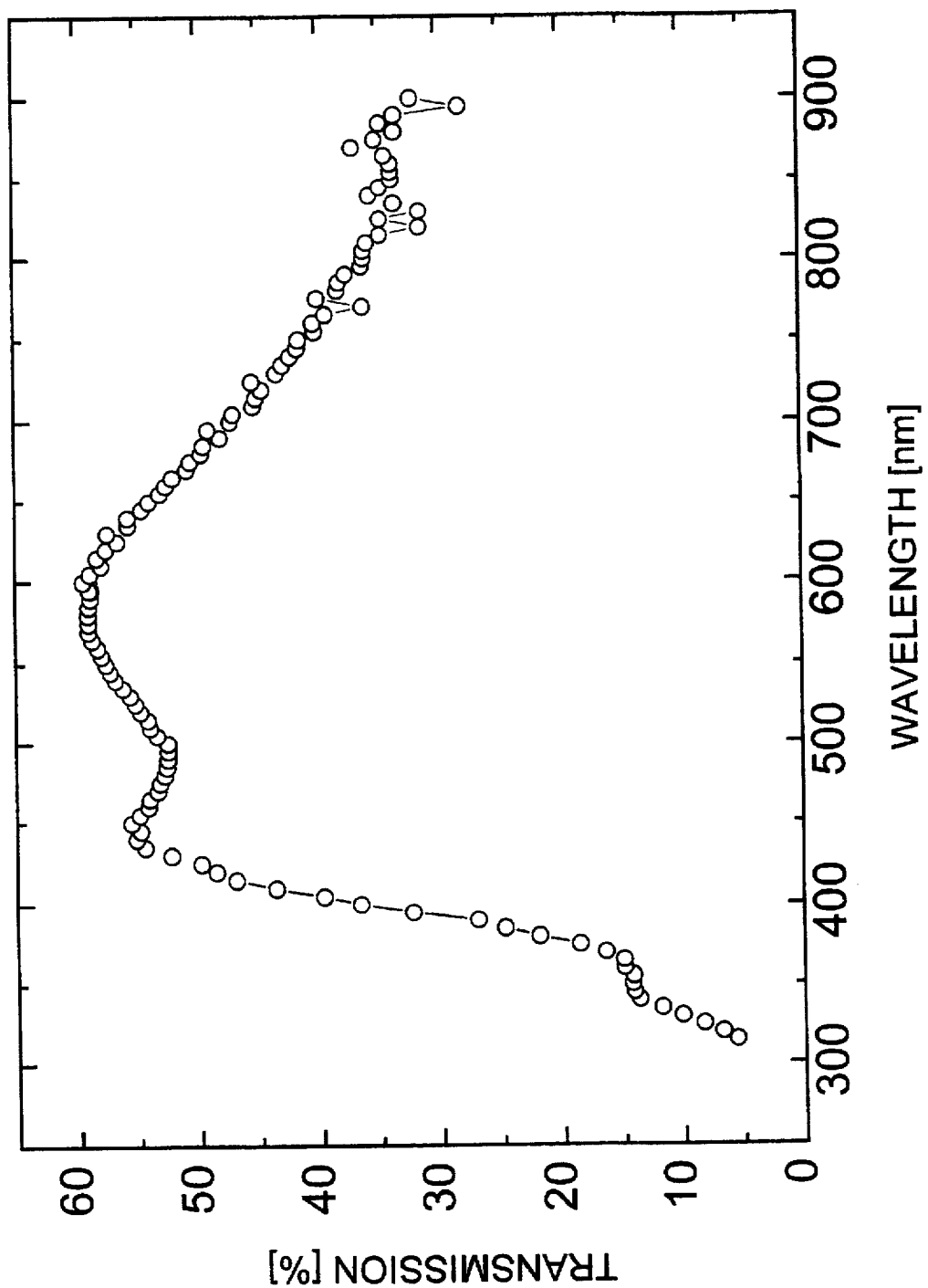
FIG. 19 is a plot of Transmission (%) versus Wavelength (nm) for showing an example of the transmission spectrum of the TOLED device of FIG. 17 with a 100 Å thick Mg—Ag electrode as a function of wavelength.
Figure 20:
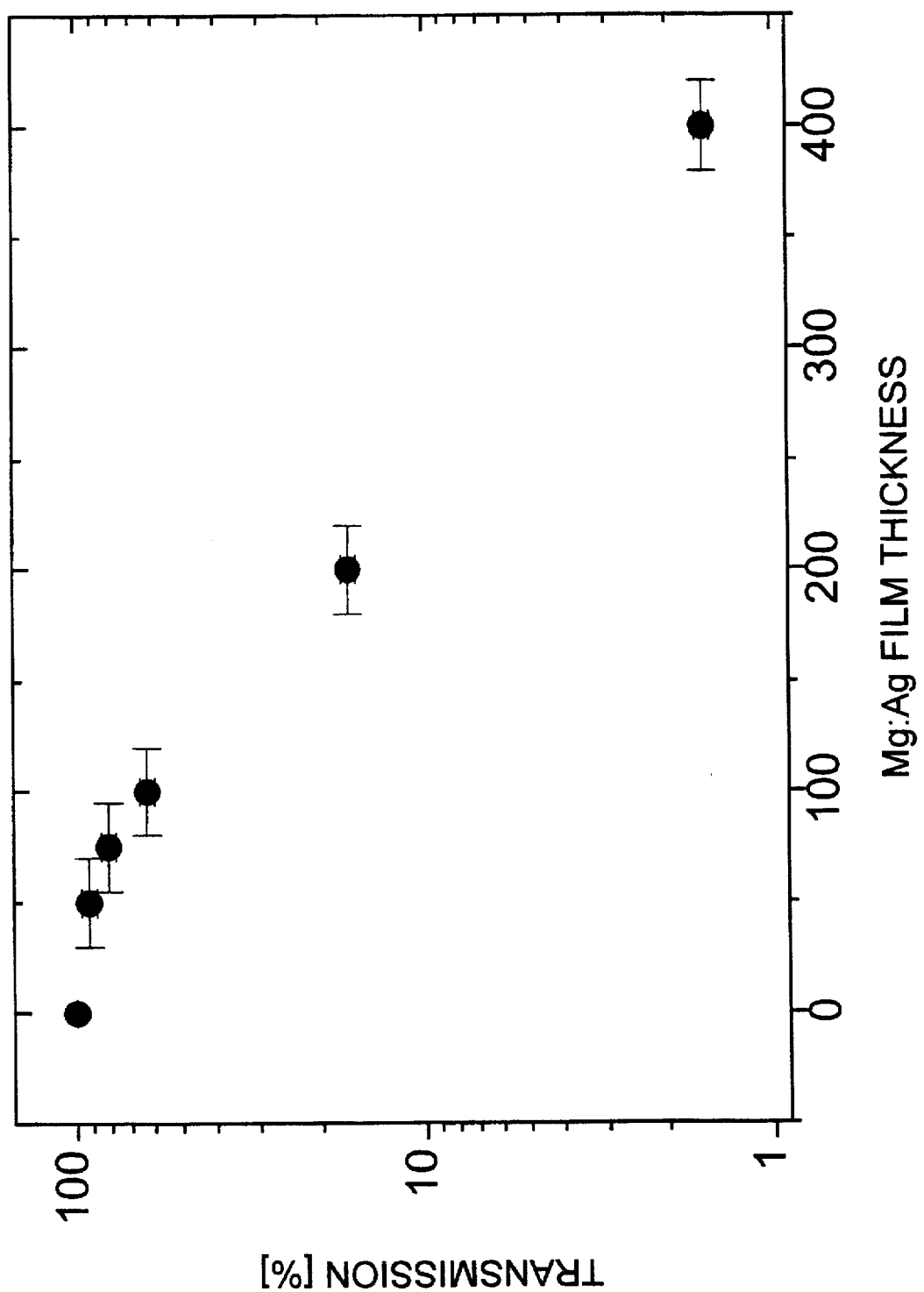
FIG. 20 shows a plot of Transmission (%) vs. Mg—Ag contact thickness at a wavelength of 530 nm, for an engineering prototype of the TOLED top contact of FIG. 17.

The transparency as a function of wavelength of the TOLED 300 with a 100 Å thick film 310 is shown in detail in FIG. 19. At the short wavelength edge of the plot, the device becomes non-transmissive due to a combination of ITO absorption, Mg—Ag absorption, and the strong molecular transitions to the L$_a$ and B$_b$ states of Alq$_3$. Note, however, that the device is 63% transparent at the peak (530 nm) emission wavelength of Alq$_3$, and this transparency extends across the visible red. Some loss is apparent in the infrared, also due to absorption by the Mg—Ag top contact. FIG. 20 shows the transmission of the Mg—Ag contact 310 at a wavelength of 530 nm with Mg—Ag film 310 thicknesses ranging from 50 Å to 400 Å. Transparencies of 92% were observed for the thinnest Mg—Ag films. The thinnest working TOLED device produced thus far by the inventors has a Mg—Ag contact 310 thickness of 75 Å, corresponding to a contact transparency of 81%, and a total device transparency of 71%. The slope of the straight line fit to the data of FIG. 20 gives an optical absorption coefficient of the Mg—Ag of $1.1 \times 10^6$ cm$^{-1}$, which is consistent with a calculated skin depth of 180 Å.

Note that while the prototype TOLED devices described above emit in the green spectral region, the structure demonstrated should work equally well for organic devices emitting in any region of the visible spectrum, since the large Franck-Condon red shift from absorption to emission is characteristic of many organic materials. Using simple fabrication processes, it is therefore possible to construct an independently addressable stack of multi-color emissive elements. Furthermore, this structure should also be useful for polymer-based OLEDs, as previously indicated. For example, Mg:Ag alloy thin film layers with an overlying ITO layer are similarly described above for use as layers 26M and 26I of the OLED devices of FIGS. 2A, 2B and 2C, for providing improved transparent contacts 26; and for layers 60M and 60I of FIGS. 12B, 12C, 12D, 12E, and layers 107M and 107I of FIGS. 13A, 13B, 13C, 13D, 13E, and 13F, for providing improved transparent contacts 60, and 107, respectively. Similarly, Mg:Ag layers 310 with overlying ITO layers 312 can be used in place of metal of metal layers 60M', 60M'', and 60M''' of the OLED device of FIG. 14A, and metal layers 160 of the OLED device of FIG. 16. In this manner, viable TOLED multicolor devices are attainable.

The method and apparatus for placing transparent contacts onto organic material layers, whether for organic light emitting devices, or other devices, will now be described. In this example, the first step is to deposit a thin film of Mg:Ag alloy in some preferred ratio, such as 40:1, respectively, on top of a target organic layer, using thermal co-evaporation of constituent metal atoms from resistively heated molybdenum boats, in this example. As previously illustrated with reference to FIG. 20, the thickness of the metal alloy film is dominant in determining the transparency of the resultant contact. A system or apparatus for accomplishing this is shown schematically in FIG. 21. Note that in the following description of the evaporation system, and of other systems of the invention, the actual components used by the inventors in this example are given in a parts list presented below, along with a following manufactures index for providing the names and addresses of the manufacturers supplying the components illustrated.

Figure 21:
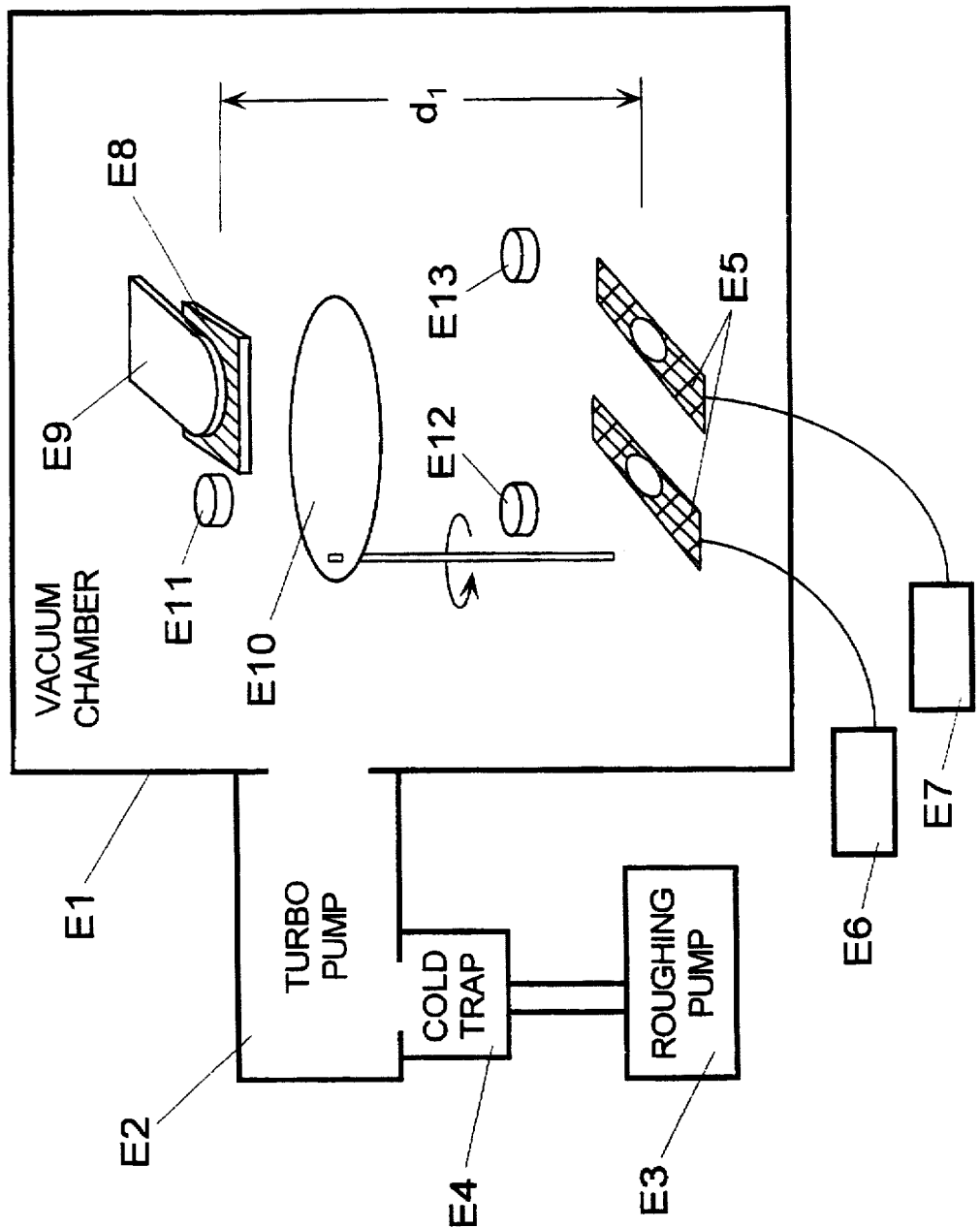
FIG. 21 shows a system for depositing a Mg:Ag film onto an organic layer on a substrate for one embodiment of the invention for partially forming a transparent contact on an organic layer.

The evaporation system for depositing the Mg:Ag film on an organic substrate, as shown in FIG. 21, will now be described in detail.

Mg:Ag film evaporation is performed in a vacuum chamber (E1) with a base pressure of about 10$^{-7}$ Torr, that is maintained by an AlCatel 150 1/sec turbo pump (E2) in conjunction with Alcatel roughing pump (E3) and a cold trap (E4). Ag and Mg source metals are loaded into molybdenum (Mo) boats (E5) which are resistively heated by 10 kW (E6) and 1 kW (E7) power supplies to evaporate or vaporize the Mg:Ag in this example. The substrate (E8) is positioned 30 cm(d$_1$) above the Mo boats (E5) and is held in place by a water-cooled non-rotating substrate holder (E9). A shutter (E10), positioned in the path between the Mo boats (E5) and the substrate (E8), can be remotely and selectively operated to be in the open or closed position to respectively enable or block Mg:Ag evaporated-film deposit on the substrate (E8) by Mg:Ag vapor. Note that in a preferred deposition system the single shutter (E10) is replaced by two shutters (E10A, E10B, not shown) for independently blocking or enabling vapor flow of Mg and Ag, respectively, from an associated boat (E5) to substrate (E8). The thickness of the deposited film is measured by a film thickness monitor (E11) located next to the substrate. Two more thickness monitors (E12, E13) are located one above each of the Mo boats (E5), respectively, in order to provide independent measurements for the evaporation rates from the two boats.

The system of FIG. 21, as described, is operated using the following steps to deposit the Mg:Ag film of this example on a substrate (E8):

Position the shutter (E10) in the closed position.

Pump the evaporation chamber (E1) until it reaches $1 \times 10^{-6}$ Torr (preferred, but can range 10$^{-3}$ Torr to 10$^{-10}$ Torr).

Turn on the 10 kW power supply (E6) and increase its power output slowly until Ag starts to melt.

Set Ag density and acoustic impedance parameters on the substrate-film thickness monitor (E11).

Set the output of the 10kW power supply (E6) so that deposition rate of Ag, as registered by the substrate thickness monitor (E11), is 0.1 Å/s, in this example, but can be as high as 5 Å/s. Note the rate (R1) registered by Ag thickness monitor (E12).

Maintain R1 constant throughout the deposition process by adjusting the output of 10 kW power supply (E6), as required.

Set Mg parameters on the substrate-film thickness monitor (E11).

Set the output of the 1 kW power supply (E7) so that deposition rate of Mg, as registered by the substrate thickness monitor (E11), is 5 Å/s, which in this example is preferred but can otherwise range 0.1 Å/s to 10 Å/s. Note the rate (R2) registered by Mg thickness monitor (E13).

Maintain R2 constant throughout the deposition process, by adjusting the output of 1kW power supply (E7), as required.

Mount the substrate (E8) onto the substrate holder (E9).

Position the shutter (E10) in the open position.

Deposit ~100 Å of Mg:Ag alloy, which is preferred in this example, but can otherwise range 50 Å to 500 Å.

Figure 22:
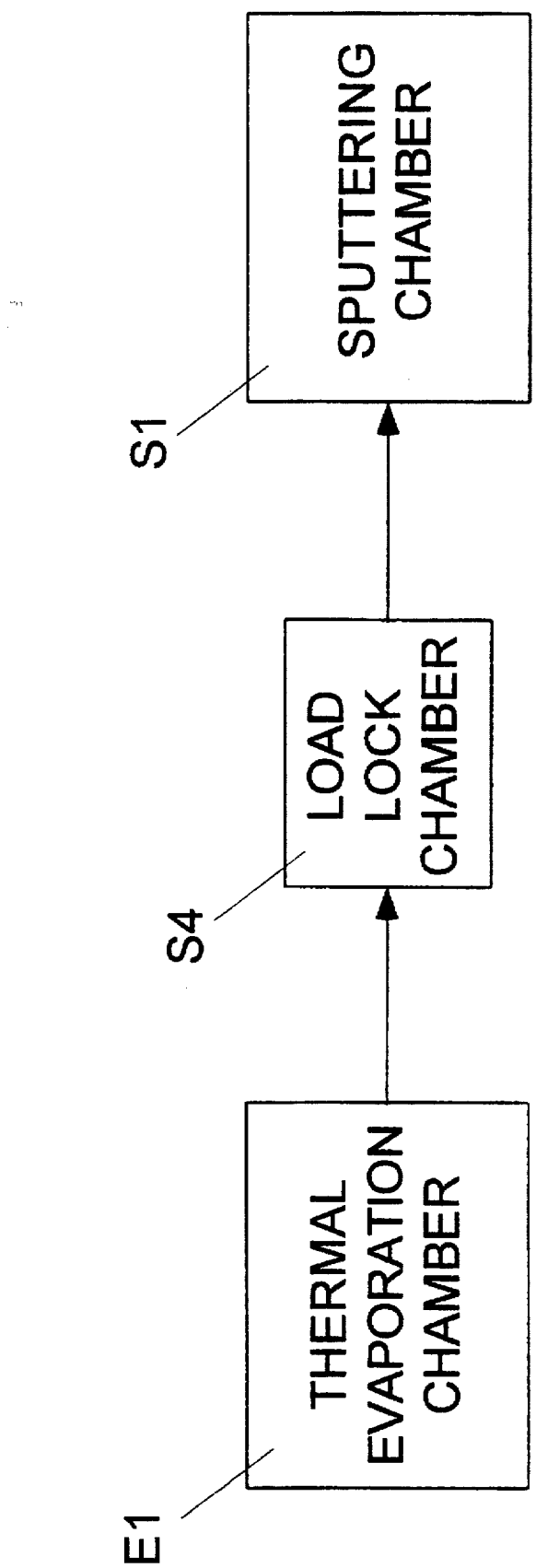
FIG. 22 shows a block diagram generally showing the three successive operations that must be carried out for forming the transparent contact on an organic layer for one embodiment of the invention.

After the Mg:Ag alloy film is deposited on substrate (E8). The substrate is transferred from the thermal evaporation chamber (E1), via a load lock chamber (S4), (see FIG. 22), to a sputtering chamber (S1) of an RF sputtering system. During this transfer, the sample is kept in vacuum, or inert atmosphere such as nitrogen or argon gas atmosphere, through Use of the load lock chamber (S4), in this example.

Next, an indium-tin oxide (ITO) film is deposited on top of the Mg:Ag metal alloy film by RF sputtering in chamber (S1). Resistivity of this ITO film is $1.5 \times 10^{-3}$ $\Omega$cm. In this example, the ITO film is 400 Å thick.

Figure 23:
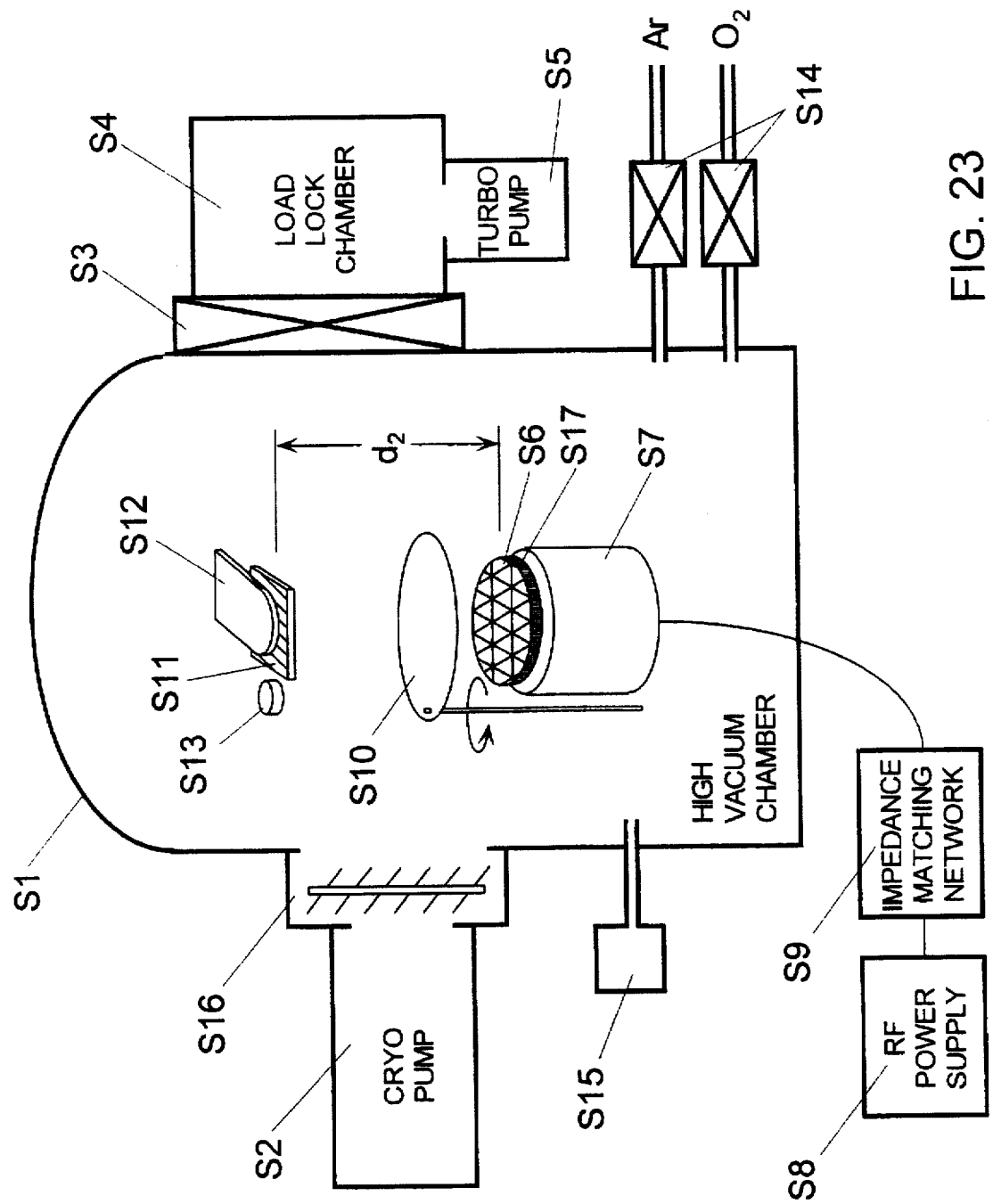
FIG. 23 shows a sputtering system for depositing an indium-tin oxide (ITO) film on top of a Mg:Ag metal alloy film previously deposited on an organic layer for one embodiment of the invention.

The sputtering system, as shown in FIG. 23, in this example, is housed in a high vacuum chamber (S1) with a base pressure ranging between $1 \times 10^{-3}$ Torr to $1 \times 10^{-10}$ Torr (lower base pressure is preferred to reduce interaction with ambient gases), that is maintained by CTI-Cryogenics Cryo-Torr 8 cryo pump (S2). Attached to this chamber via gate valve (S3) is a load-lock chamber (S4) with base pressure ranging from atmospheric to $1 \times 10^{-10}$ Torr (lower base pressure is preferred), that is maintained by Leybold Turbovac 50 turbo pump (S5). Through the load-lock chamber (S4) samples are introduced into the sputtering system and extracted out at completion of deposition. In this example, the sputtering target (S6), manufactured by Pure Tech., Inc. is 10% $SnO_2$ and 90% $In_2O_3$ by weight, with 99% purity. Target (S6) has a diameter of two inches with a thickness of one-eighth of an inch. A copper backing plate (S17), one-eighth inch thick, is attached by vacuum epoxy to the back of the target (S6) to prevent target (S6) from overheating and cracking. The target (S6) is housed in an AJA International magnetron sputtering gun (S7), powered by advanced Energy RF Power supply (S8) (with 600 W maximum RF power output, and operating frequency of 13.56 MHz) in conjunction with Advanced Energy auto-tunable impedance matching network (S9). Any RF power supply that provides at least 20 W RF power is sufficient. A shutter (S10), positioned over the sputtering gun (S7) and the target (S6), can be selectively positioned in the open or closed position to respectively enable or prevent sputtered-film deposition on the substrate (S11). The substrate (S11) is positioned 15 cm($d_2$) above the shuttered target (S6) and is held in place by a water-cooled non-rotating substrate holder (S12). Note that $d_2$ can preferably range from 5 cm to 30 cm, but can be greater. The thickness of the deposited film is measured by a calibrated film thickness monitor (S13) located next to the substrate (S11). The sputtering gas is a mix of argon (Ar) (99.9999% pure) and oxygen ($O_2$) (99.998% pure). The flow of gasses into the sputtering chamber (S1) is controlled by individual MKS mass flow controllers (S14). The gas pressure inside the sputtering chamber (S1) is monitored by an MKS Baratron type 121A absolute pressure transducer (S15) and controlled by a butterfly valve (S16) positioned in front of the cryo pump (S2).

The sputtering system of FIG. 23 is operated to deposit an ITO layer on top of the Mg:Ag film using the following operational steps:

Remove the sample from vacuum chamber (E1).

Introduce the sample into the load lock chamber (S4).

Pump down the load lock chamber until it reaches its base pressure.

Transfer the sample into the sputtering chamber (S1) and position it over the sputtering target (S6).

Position the target shutter (S10) in the closed position.

Set argon (Ar) gas flow into the sputtering chamber at a preferred rate of 200 sccm (can range 20 sccm to 1,000 sccm depending upon the system pumping speed), and oxygen ($O_2$) flow preferably at 0.1 sccm (can range 0.0 sccm to 100 sccm dependent upon both the Argon gas flow rate and the sputtering power, where greater flow of $O_2$ is required for higher sputtering power).

Set the butterfly valve (S16) to maintain the chamber pressure of 20 mTorr, preferred in this example, or as low as 1 mTorr, but must be sufficient to allow for ignition of the plasma, and to sustain the plasma.

Set the RF power supply (S8) to an output power between 15 W to 30 W and enable it. When the auto-tuned impedance matching network (S9) finds the optimal setting the plasma should ignite.

Reduce the pressure inside the sputtering chamber (S1) to 5 mTorr by setting the butterfly valve (S16), in order to sustain the plasma as the power is decreased in the next step.

Slowly reduce the output power on the RF power supply (S8) equal to or less than 5 W, making sure impedance matching network (S9) has enough time to respond to the change.

Position the target shutter (S10) in the open position.

Deposit between 50 Å to 600 Å of ITO, dependent upon the desired balance between transparency of the ITO layer, and its electrical conductivity.

Note that an important embodiment of the invention is the use of low RF power (5 W or less) in sputtering ITO to deposit a thin film of ITO onto the Mg:Ag layer in this example, to avoid damaging the underlying organic layer. The RF power can be reduced to below 5 W by using different gas mixtures in the sputtering chamber, such as 1 Xe:10 Ar, or 1 $CH_3$:20 Ar, to further avoid damaging the organic layer while maintaining the growth rate for the ITO film. It is preferred that the RF power in the sputtering chamber be slowly reduced to the minimum wattage for sustaining ignition of the plasma.

A parts list, as given below in Table 1, for reference designations (E1) through (E13), for the deposition system of FIG. 21, and (S1) through (S17), for the sputtering system of FIG. 23, lists the description, part or model number, and associated manufacturer. Table 1 is followed by a manufacturer's index listing, providing the identified manufacturer's names in full along with their last known address and telephone numbers. It should be noted that the invention is not meant to be limited to use of the illustrated components and parts, and manufacturers, and is provided herein only to fully illustrate apparatus employed by the inventors in developing their invention through experimental engineering prototypes.

TABLE 1

| ITEM # | ITEM DESCRIPTION | MODEL # | MANUF. |
|---|---|---|---|
| E1 | Vacuum Chamber | DV-502A | Denton |
| E2 | 150 l/s Turbo Pump | CFF-450 Turbo | Alcatel |
| E3 | Mechanical Roughing Pump | 2008A | Alcatel |
| E4 | Liquid Nitrogen Cold Trap | standard | Denton |
| E5 | Molybdenum Source Boats | standard | Mathis |
| E6 | 10 kW Power Supply | standard | Denton |
| E7 | 1 kW Power Supply | standard | Denton |
| E8 | User Provided Substrate | — | — |
| E9 | Water Cooled Substrate Holder | custom | Denton |
| E10 | Shutter | standard | Denton |
| E11 | Film Thickness Monitor | STM-100/MF | Sycon |
| E12 | Film Thickness Monitor | STM-100/MF | Sycon |
| E13 | Film Thickness Monitor | STM-100/MF | Sycon |
| S1 | Vacuum Chamber | — | DCA Inst. |
| S2 | Cryogenic Pump | Cryp-Torr 8 | CTI |
| S3 | Gate Valve (6 inch diameter) | GC-4000M | MDC |

TABLE 1-continued

| S4  | Load Lock Chamber (6 in., 6 way cross) | custom | MDC |
| --- | --- | --- | --- |
| S5  | Turbo Pump | Turbovac 50 | Leybold |
| S6  | 10% SnO$_2$, 90% In$_2$O$_3$ target (2 in. diam.) | with Cu backplate (S17) | Pure Tech |
| S7  | RF Magnetron Sputtering Gun | — | AJA Intern. |
| S8  | 600W 13.56 MHz RF Power Supply | RFX-600 | Adv. Energy |
| S9  | Impedence Matching Network | ATX-600 | Adv. Energy |
| S10 | Integral part of S7 | — | AJA Intern. |
| S11 | User Provided Substrate | custom | — |
| S12 | Water Cooled Substrate Holder | custom | DCA Inst. |
| S13 | Film Thickness Monitor | STM-100/MF | Sycon |
| S14 | Mass Flow Controllers | 1259C | MKS |
| S15 | Absolute Pressure Transducer | Baratron #121A | MKS |
| S16 | Butterfly Valve | L6691-301 | Varian |
| S17 | Bu Backplate | Epoxied to (S6) | Pure Tech |

MANUFACTURER INDEX:

Adv. Energy:
Advanced Energy Industries, Inc.
1600 Prospect Parkway, Fort Collins, CO 80525
(303) 221-4670

AJA Inern.:
AJA International
North Scituate, MA 02060
(800) 767-3698

Alcatel:
Alcatel Vacuum Products, Inc.
Hingham, MA 02043
(617) 331-4200

CTI:
CTI-Cryogenics
Mansfield, MA 02048
(508) 337-5000

DCA Inst.
DCA Instruments, Inc.
400 West Cummings Park, Suite 3900, Woburn, MA 01801
(617) 937-6550

Denton:
Denton Vacuum, Inc.
Moorestown, NJ 08057
(609) 439-9100

Leybold:
Leybold Vacuum Products, Inc.
Export, PA 15632
(800) 443-4021

Mathis:
R. D. Mathis Co.
2840 Gundry Ave., P.O. Box 6187, Long Beach, CA 90806
310) 426-7049

MDC:
MDC Vacuum Products Corp.
Hayward, CA 94545
(510) 887-6100

MKS:
MKS
6 Shattuck Rd., Andover, MA 01810
(508) 975-2350

TABLE 1-continued

Pure Tech:
Pure Tech, Inc.
Carmel, NY 10512
(914) 878-4499

Sycon:
Sycon Instruments
6757 Kinne St., East Syracuse, NY 13057
(315) 463-5297

Varian:
Varian Vacuum Products
Lexington, MA 02173
(800) 8-VARIAN.

In another embodiment of the invention for growing the ITO layer 312 onto the Mg:Ag film 310, in this example (see FIG. 17), it was recently discovered that the ITO growth rate can be increased by growing the first 50–100 Å by the non-destructive (slow) method given above, followed by stepping up the rate to make the contact 312 thicker (typically 400–1000 Å) using higher power settings for RF power supply (S8) (20 W–40 W, for example). Since there is already a protective cap of 50–100 Å grown at lower power settings for (S8) (1 W–7 W, for example), this second, quickly grown ITO layer does not have the ability to penetrate the first ITO slow-grown contact and destroy the underlying Mg:Ag and organic layers 310, 308, respectively. It was also discovered that Alq$_3$ and related compounds for the organic layers are very immune to this damage, whereas the blue compounds are vulnerable. As a result the inventors now put in a "double heterostructure" (see FIG. 1A), e.g. first the TPD 306, then a blue emitter material layer ranging in thickness between 50 Å to 1,000 Å, followed by a layer of Alq$_3$ ranging in thickness from 300 Å to 1,000 Å. The resultant TOLED device still luminesces blue.

Those with skill in the art may recognize various modifications to the embodiments of the invention described and illustrated herein. Such modifications are meant to be covered by the spirit and scope of the appended claims. For example, a multicolor stacked LED device, such as the above-described three color device of FIG. 2, in another embodiment of the invention can be provided by forming LED 20 from a polymer device as shown in FIG. 1C, or from a deposited metal phosphonate film, rather than having all three layers laid down in vacuo. The two remaining stacked LEDs could be formed by vapor deposition, or other techniques. Also, the Mg:Ag alloy can range from 1 Mg:1 Ag to 40Mg:1Ag to 100% Mg with proper chemistry. In yet another embodiment the ITO layers for the TOLED device can be formed by presputtering, spraying, or dipping.

What is claimed is:

1. A light emitting device including at least one organic light emitting device (OLED) that is substantially transparent (TOLED) when de-energized, comprising:

a substantially transparent substrate having top and bottom surfaces;

a first substantially transparent thin film coating of indium tin oxide (ITO) applied to the top surface of said substrate;

a substantially transparent coating of a hole conducting material applied over said ITO layer;

a substantially transparent layer of an electron conducting and highly electroluminescent organic material overlaying said ITO layer;

a relatively thin film of a substantially transparent metal electrode applied over said organic material layer;

a second substantially transparent thin film coating of ITO overlying said metal electrode film; and first and second electrical contacts bonded to said first and second ITO layers for receiving a bias voltage to energize said device, and cause it to emit light of a given color from top and bottom surfaces thereof.

2. The TOLED device of claim 1, wherein said metal electrode consists of an alloy of magnesium (Mg) and silver (Ag).

3. The TOLED device of claim 2, wherein said alloy has an atomic ratio ranging from 1 Mg:1 Ag to 40 Mg:1 Ag to 100% Mg.

4. The TOLED device of claim 1, wherein the organic material layer includes $Alq_3$.

5. The TOLED device of claim 2, wherein the organic material layer includes $Alq_3$.

6. The TOLED device of claim 1, wherein said substrate consists of glass.

7. The TOLED device of claim 1, wherein said hole conducting material consists of TPD.

8. The TOLED device of claim 1, wherein the hole conducting material layer is 200 Å thick.

9. The TOLED device of claim 1, wherein the hole conducting material layer is 400 Å thick.

10. The TOLED device of claim 1, wherein said metal electrode layer has a thickness ranging from 50 Å to 400 Å.

11. The TOLED device of claim 1, wherein said first and second ITO layers are 2,000 Å and 400 Å thick, respectively.

12. The light emitting device of claim 1, further including:

a plurality of said TOLED devices stacked upon one another in a layered structure;

a plurality of substantially transparent electrically conductive layers separating each one of said plurality of TOLED devices; and a plurality of third electrical contacts each individually bonded to one of said plurality of electrically conductive layers, respectively, for enabling each TOLED device to receive between its associated first and third contacts a separate bias potential to energize it for emitting light through its associated stack.

13. The light emitting device of claim 12, wherein each of said TOLED devices in the stack emits when energized a different wavelength or color of light through the stack.

14. A light emitting device including at least one organic light emitting device (OLED) that is substantially transparent (TOLED) when de-energized, comprising:

a substantially transparent substrate having top and bottom surfaces;

a first substantially transparent thin film coating of electrically conductive material applied to the top surface of said substrate;

at least one substantially transparent layer including a highly electroluminescent organic material overlying said first layer of electrically conductive material;

a second substantially transparent thin film coating of electrically conductive material overlying said layer of organic material; and first and second electrical contacts bonded to said first and second electrically conductive coatings for receiving a bias voltage to energize said device, and cause it to emit light of a given color from top and bottom surfaces thereof.

15. The TOLED device of claim 14, wherein said first conductive layer consists of a thin film coating of indium tin oxide (ITO).

16. The TOLED device of claim 14, wherein said second coating of electrically conductive material includes:

a layer of a low work function metal overlying said organic material layer; and a layer of indium tin oxide (ITO) overlying said layer of low work function metal.

17. The TOLED device of claim 16, wherein said low work function metal consists of an alloy of low work function magnesium (Mg), and silver (Ag).

18. The TOLED device of claim 14, further including a substantially transparent layer of a hole conducting material providing a hole transport layer (HTL) sandwiched between said first coating of electrically conductive material and said electroluminescent organic material layer.

19. The TOLED device of claim 18 further including a substantially transparent layer of an electron conducting material providing an electron transport layer (ETL) sandwiched between said second coating of electrically conductive material and said electroluminescent organic material layer.

20. The TOLED device of claim 17, wherein said alloy has an atomic ratio ranging from 1 Mg:1 Ag to 40 Mg:1 Ag to 100% Mg.

21. The TOLED device of claim 14, wherein the organic material layer includes $Alq_3$.

22. The TOLED device of claim 17, wherein the organic material layer includes $Alq_3$.

23. The TOLED device of claim 14, wherein said substrate consists of one of glass or plastic material.

24. The TOLED device of claim 18, wherein said hole conducting material consists of TPD.

25. The TOLED device of claim 18, wherein the hole conducting material layer is 200 Å thick.

26. The TOLED device of claim 16, wherein said metal electrode layer has a thickness ranging from 50 Å to 400 Å.

27. The TOLED device of claim 15, wherein said ITO layers are 2,000 Å and 400 Å thick, respectively.

28. The light emitting device of claim 14, further including:

a plurality of said TOLED devices stacked upon one another in a layered structure;

a plurality of substantially transparent electrically conductive layers separating each one of said plurality of TOLED devices; and a plurality of third electrical contacts each individually bonded to one of said plurality of electrically conductive layers, respectively, for enabling each TOLED device to receive between its associated first and third contacts a separate bias potential to energize it for emitting light through its associated stack.

29. The light emitting device of claim 28, wherein each of said TOLED devices in the stack emits when energized a different wavelength or color of light through the stack.

* * * * *

UNITED STATES PATENT AND TRADEMARK OFFICE
CERTIFICATE OF CORRECTION

PATENT NO.  : 5,703,436
DATED       : December 30, 1997
INVENTOR(S) : Forrest et al It is certified that error appears in the above-identified patent and that said Letters Patent is hereby corrected as shown below:

Column 1, line 3, insert:

-- <u>GOVERNMENT RIGHTS</u>

This invention was made with Government support under Contract No. F33615-94-1-1414 awarded by DARPA. The government has certain rights in this invention.--

Signed and Sealed this

Twenty-first Day of March, 2000

Attest:

Q. TODD DICKINSON

*Attesting Officer*      *Commissioner of Patents and Trademarks*